United States Patent
Arimoto

(10) Patent No.: US 6,304,494 B1
(45) Date of Patent: Oct. 16, 2001

(54) SEMICONDUCTOR DEVICE WITH DECREASED POWER CONSUMPTION

(75) Inventor: Kazutami Arimoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/657,146

(22) Filed: Sep. 7, 2000

(30) Foreign Application Priority Data

Sep. 10, 1999 (JP) .................................................. 11-256842

(51) Int. Cl.⁷ ...................................................... G11C 7/00
(52) U.S. Cl. ...................... 365/189.09; 365/205; 365/227
(58) Field of Search .................................. 365/205, 226, 365/227, 203, 149, 189.09

(56) References Cited

U.S. PATENT DOCUMENTS

| | | | |
|---|---|---|---|
| 5,229,964 | * 7/1993 | Yamauchi | 365/189.01 |
| 5,264,058 | 11/1993 | Yamauchi | 365/203 |
| 5,719,814 | 2/1998 | Ishikawa | 365/205 |
| 5,764,580 | * 6/1998 | Suzuki et al. | 365/205 |
| 6,088,275 | 7/2000 | Tanaka | 365/205 |
| 6,115,284 | * 9/2000 | Matsumiya et al. | 365/149 |

FOREIGN PATENT DOCUMENTS

| | | | |
|---|---|---|---|
| 11-86549 | 3/1999 | (JP) | G11C/11/407 |
| WO 9724729 | 7/1997 | (WO) | G11C/11/407 |
| WO 97/28532 | 8/1997 | (WO) | G11C/11/409 |

OTHER PUBLICATIONS

European Search Report dated Dec. 18, 2000.

* cited by examiner

Primary Examiner—Son Mai
(74) Attorney, Agent, or Firm—McDermott, Will & Emery

(57) ABSTRACT

A source potential control circuit applies supply potential $V_{DD2}(<V_{DD1})$ to a common source line in a write operation and applies supply potential $V_{DD1}$ thereto after data is inverted for restoring. Accordingly, supply potential can be reduced and thus reduced power consumption is achieved without complicated manufacturing process.

17 Claims, 17 Drawing Sheets

SEMICONDUCTOR DEVICE WITH DECREASED POWER CONSUMPTION

BACKGROUND OF THE INVENTION

1. Field of the Invention

The present invention relates to semiconductor devices, and particularly to potential control of a dynamic random access memory.

2. Description of the Background Art

A personal computer and a workstation each include a memory for storing data. An example of the memory is a DRAM (Dynamic Random Access Memory) with a great capacity from and into which data can be read and written. The DRAM is used as a main memory in the personal computer, workstation and the like. In recent years, an embedded DRAM composed of a DRAM and a logic circuit such as arithmetic circuit which are mounted on the same chip has been employed in a digital still camera and a notebook personal computer.

A memory cell of the DRAM is constituted of one transistor and one capacitor. One memory cell stores 1 bit of information depending on whether or not charges are stored in the capacitor. Generally the supply voltage is reduced in order to decrease power consumption of the DRAM. However, just the reduction of the supply voltage results in decrease of the amount of charges stored in the memory cell. In order to avoid this decrease, capacitance of the capacitor may be increased. Increase of the capacitance is achieved by forming the capacitor as a stacked type having a three-dimensional structure so as to increase the area of the capacitor electrode, or forming a dielectric film of the capacitor of material having a high dielectric constant (high dielectric material) so as to increase relative dielectric constant.

The techniques of forming the capacitor having the three-dimensional structure or forming the dielectric film of high dielectric material both have been employed. However, in order to further decrease the power consumption by reducing the voltage, a capacitor of a more complicated three-dimensional structure or material with higher dielectric constant is requested. This complicates the manufacturing process, resulting in increased manufacturing cost.

SUMMARY OF THE INVENTION

One object of the present invention is to provide a semiconductor device with decreased power consumption.

A semiconductor device according to one aspect of the present invention includes a pair of bit lines, first and second source lines, a sense amplifier, and a source potential control circuit.

A plurality of memory cells are connected to the pair of bit lines. The sense amplifier connected to the pair of bit lines and the first and second source lines amplifies potential on one of the bit lines to potential on the first source line and amplifies potential on the other bit line to potential on the second source line. When a write operation is requested, the source potential control circuit supplies a first potential to the first source line, supplies a second potential lower than the first potential to the second source line, and supplies a third potential higher than the first potential to the first source line after supply of write data to the pair of bit lines.

According to another aspect of the invention, a semiconductor device includes first and second pairs of bit lines, an N channel sense amplifier, a first pair of N channel MOS transistors, a second pair of N channel MOS transistors, first and second P channel sense amplifiers, a source potential control circuit, and a row decoder.

A plurality of memory cells are connected to each of the first and second pairs of bit lines. The N channel sense amplifier is shared by the first and second pairs of bit lines. The first pair of N channel MOS transistors is connected between the N channel sense amplifier and the first pair of bit lines. The second pair of N channel MOS transistors is connected between the N channel sense amplifier and the second pair of bit lines.

The first and second P channel sense amplifiers are connected respectively to the first and second pairs of bit lines. Each of the P channel sense amplifiers is connected to a source line and amplifies potential on one of the bit lines of the bit line pair connected thereto to potential on that source line.

When a write operation is requested, the source potential control circuit supplies a first potential to the source line, and supplies a second potential higher than the first potential to the source line after supply of write data to one of the first and second pairs of bit lines. The row decoder supplies a predetermined potential which is equal to or less than a second potential to the gates of the first and second pairs of N channel MOS transistors.

According to still another aspect of the invention, a semiconductor device includes first and second banks.

The first bank includes a first pair of bit lines to which a plurality of memory cells are connected, first and second source lines, and a first sense amplifier connected to the first pair of bit lines and the first and second source lines to amplify potential on one bit line of the first bit line pair to potential on the first source line and amplify potential on the other bit line thereof to potential on the second source line. The first bank further includes a first source potential control circuit which supplies, when a write operation is requested, a first potential to the first source line, supplies a second potential lower than the first potential to the second source line, and supplies a third potential higher than the first potential to the first source line after supply of write data to the bit line pair.

The second bank includes a second pair of bit lines to which a plurality of memory cells are connected, third and fourth source lines, and a second sense amplifier connected to the second pair of bit lines and the third and fourth source lines to amplify potential on one bit line of the second bit line pair to potential on the third source line and amplify potential on the other bit line thereof to potential on the fourth source line. The second bank further includes a second source potential control circuit which supplies, when a write operation is requested, the first potential and the second potential respectively to the third and fourth source lines, supplies the second potential to the fourth source line, and supplies the third potential to the third source line after supply of write data to the second pair of bit lines.

The write operation carried out in the second bank overlaps the write operation in the first bank.

A chief advantage of the present invention is accordingly that power consumption can be reduced by lowering the potential on the source line when the write operation is performed.

Another advantage of the invention is that gate potential of transistors for isolation gate provided between the bit lines and the N channel sense amplifier can be decreased and thus reduction of power consumption is possible.

Still another advantage of the invention is that decrease of speed due to lowered potential on the source line in the write operation can be avoided by bank operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A DRAM contained LSI according to one embodiment of the invention is hereafter described in conjunction with FIGS. 1 to 8.

Figure 1:
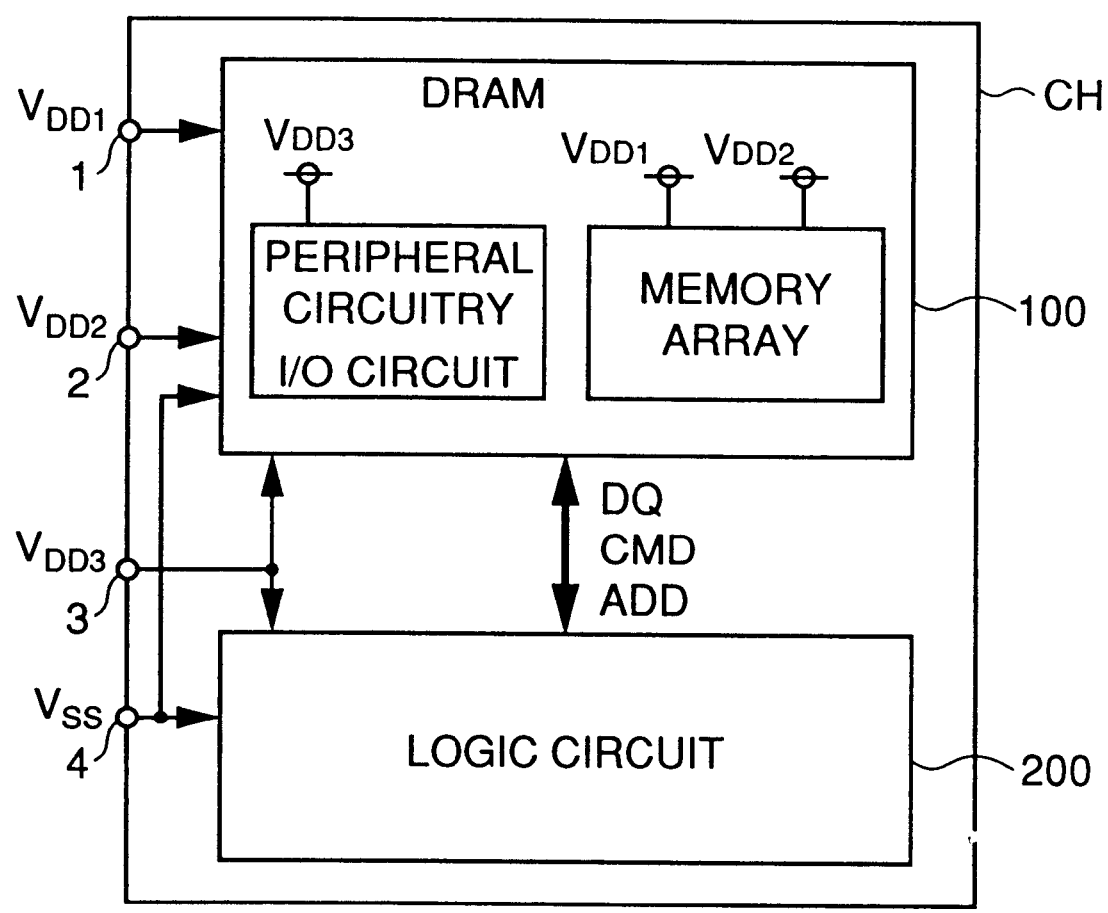
FIG. 1 is a block diagram illustrating a DRAM contained LSI in a first embodiment of the invention.

Referring to FIG. 1, the DRAM contained LSI includes a DRAM 100 and a logic circuit 200 formed on the same chip CH. DRAM 100 and logic circuit 200 are connected by a data bus having a large width of 128 bits or 256 bits for example to supply and receive data DQ therebetween. DRAM 100 and logic circuit 200 are also connected by a control bus for transmitting command CMD designating an operation of DRAM 100 from logic circuit 200 to DRAM 100. Further, DRAM 100 and logic circuit 200 are connected by an address bus for transmitting address signal ADD from logic circuit 200 to DRAM 100.

The DRAM contained LSI further includes power supply pins 1 to 4. Power supply potentials $V_{DD1}$, $V_{DD2}$, $V_{DD3}$ and $V_{SS}$ are externally supplied to power supply pins 1 to 4 respectively. In this embodiment, power supply potentials $V_{DD1}$, $V_{DD2}$, $V_{DD3}$ and $V_{SS}$ are respectively 2.0V, 1.0V, 2.5V and 0V (ground). Power supply potentials $V_{DD1}$, $V_{DD2}$ and $V_{DD3}$ are used as high level potential and supply potential $V_{SS}$ is used as low level potential.

DRAM 100 receives supply potentials $V_{DD1}$, $V_{DD2}$, $V_{DD3}$ and $V_{SS}$ to operate. DRAM 100 carries out an operation according to command CMD supplied from logic circuit 200. When a read operation is requested by command CMD, DRAM 100 outputs data stored in a memory cell of an address designated by address signal ADD to the logic circuit. When a write operation is requested, DRAM 100 stores data supplied from logic circuit 200 in a memory cell of an address designated by address signal ADD. DRAM 100 includes a memory array receiving supply potentials $V_{DD1}$ and $V_{DD2}$ to operate, and peripheral circuitry and an I/O circuit which receive supply potential $V_{DD3}$ to operate.

Logic circuit 200 receives supply potentials $V_{DD3}$ and $V_{SS}$ to operate. Logic circuit 200 reads data stored in DRAM 100, performs operation on the read data, and writes data obtained by the operation into DRAM 100. The operation includes both logical operation and arithmetic operation. Examples of the arithmetic operation are addition and multiplication, for example. Another possible operation is that a program is stored in DRAM 100, logic circuit 200 reads the program as data DQ from DRAM 100, and then the read program is executed.

Figure 2:
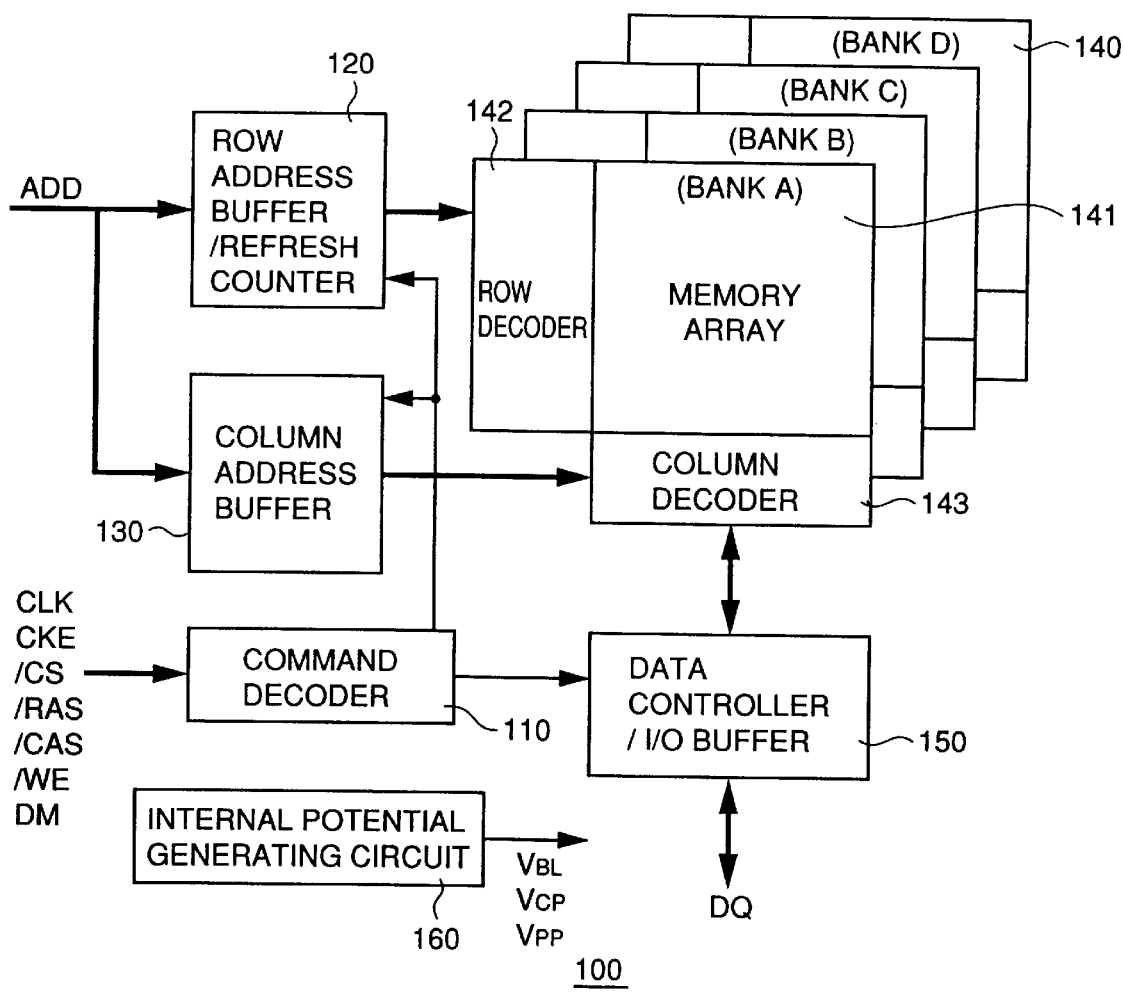
FIG. 2 is a block diagram illustrating a DRAM in the DRAM contained LSI of the first embodiment of the invention.

FIG. 2 is a schematic block diagram of DRAM 100. Referring to FIG. 2, DRAM 100 includes a command decoder 110. Command decoder 110 latches various control signals from logic circuit 200 (e.g. clock enable signal CKE, chip select signal /CS, row address strobe signal /RAS, column address strobe signal /CAS, write enable signal /WE and data mask signal DM) synchronously with clock signal CLK to decode these control signals. An operation command is designated by a logical combination of these control signals. The control signals are represented by CMD in FIG. 1. Command decoder 110 decodes a supplied command to output internal control signals of a plurality of types in order to control the operation of DRAM 100 in response to the command.

DRAM 100 further includes a row address buffer/refresh counter 120. Row address buffer/refresh counter 120 receives address signal ADD containing a plurality of address signal bits, supplied from logic circuit 200, and outputs a row address signal and an internal bank address signal. Row address buffer/refresh counter 120 supplies address signal ADD as a row address signal and an internal bank address signal when an internal control signal from command decoder 110 indicates that a read or write operation is requested.

Row address buffer/refresh counter 120 generates and supplies a row address signal and an internal bank address signal by itself regardless of address signal ADD when an internal control signal from command decoder 110 indicates that a refresh operation is requested.

DRAM 100 further includes a column address buffer 130. Column address buffer 130 receives address signal ADD from logic circuit 200 and outputs a column address signal and an internal bank address signal. In response to an internal control signal from command decoder 110, column address buffer 130 supplies address signal ADD as a column address signal and an internal bank address signal.

DRAM 100 further includes a plurality of banks 140 referred to as banks A, B, C and D. Each bank includes a memory array 141 having a plurality of memory cells arranged in a plurality of rows and a plurality of columns, a row decoder 142 for selecting a row of memory array 141, and a column decoder 143 for selecting a column of memory array 141. Each bank 140 is structured such that a memory cell of an address independent of an address of a memory cell selected in another bank can be selected. In other words, an arbitrary memory cell in each bank can be selected regardless of a memory cell selected in an another bank.

Row decoder 142 decodes a row address signal and an internal bank address signal from row address buffer/refresh counter 120. Row decoder 142 selects a memory cell of a row according to the row address signal in bank 140 according to the internal bank address signal.

Column decoder 143 decodes a column address signal and an internal bank address signal from column address buffer 130. Column decoder 143 selects data of a column according to the column address signal in bank 140 according to the internal bank address signal.

DRAM 100 further includes a data controller/input/output buffer 150. In response to an internal control signal from command decoder 110, data controller/input/output buffer 150 outputs data DQ from memory array 141 to logic circuit 200 in synchronization with clock signal CLK. In response to an internal control signal from command decoder 110, data controller/input/output buffer 150 supplies data DQ from logic circuit 200 to memory array 141 in synchronization with clock signal CLK.

In read operation, data controller/input/output buffer 150 receives a column address to start output of data DQ when cycles of clock signal CLK corresponding to the value of /CAS latency have passed. Data corresponding to the burst length are output serially to each of a plurality of data buses (e.g. 128 bits) connecting DRAM 100 and logic circuit 200. Data controller/input/output buffer 150 can output data from memory array 141 selected by column decoder 143 serially to each data bus.

In write operation, data controller/input/output buffer 150 successively takes in write data corresponding to the burst length which are serially supplied to each of the plurality of data buses connecting DRAM 100 and logic circuit 200 synchronously with clock signal CLK, and supplies the write data to a column of a memory array selected by column decoder 143. It is possible to prevent a part of the write data from being taken by data mask signal DM.

Among the blocks of DRAM 100 illustrated in FIG. 2, command decoder 110, row address buffer/refresh counter 120, column address buffer 130, row decoder 142, column decoder 143, and data controller/input/output buffer 150 are included in the peripheral circuitry and I/O circuit shown in FIG. 1. DRAM 100 further includes an internal potential generating circuit 160 for output of potential such as precharge potential $V_{BL}$ on a bit line corresponding to an intermediate potential $(V_{DD1}+V_{SS})/2$ between supply potentials $V_{DD1}$ and $V_{SS}$.

Figure 3:
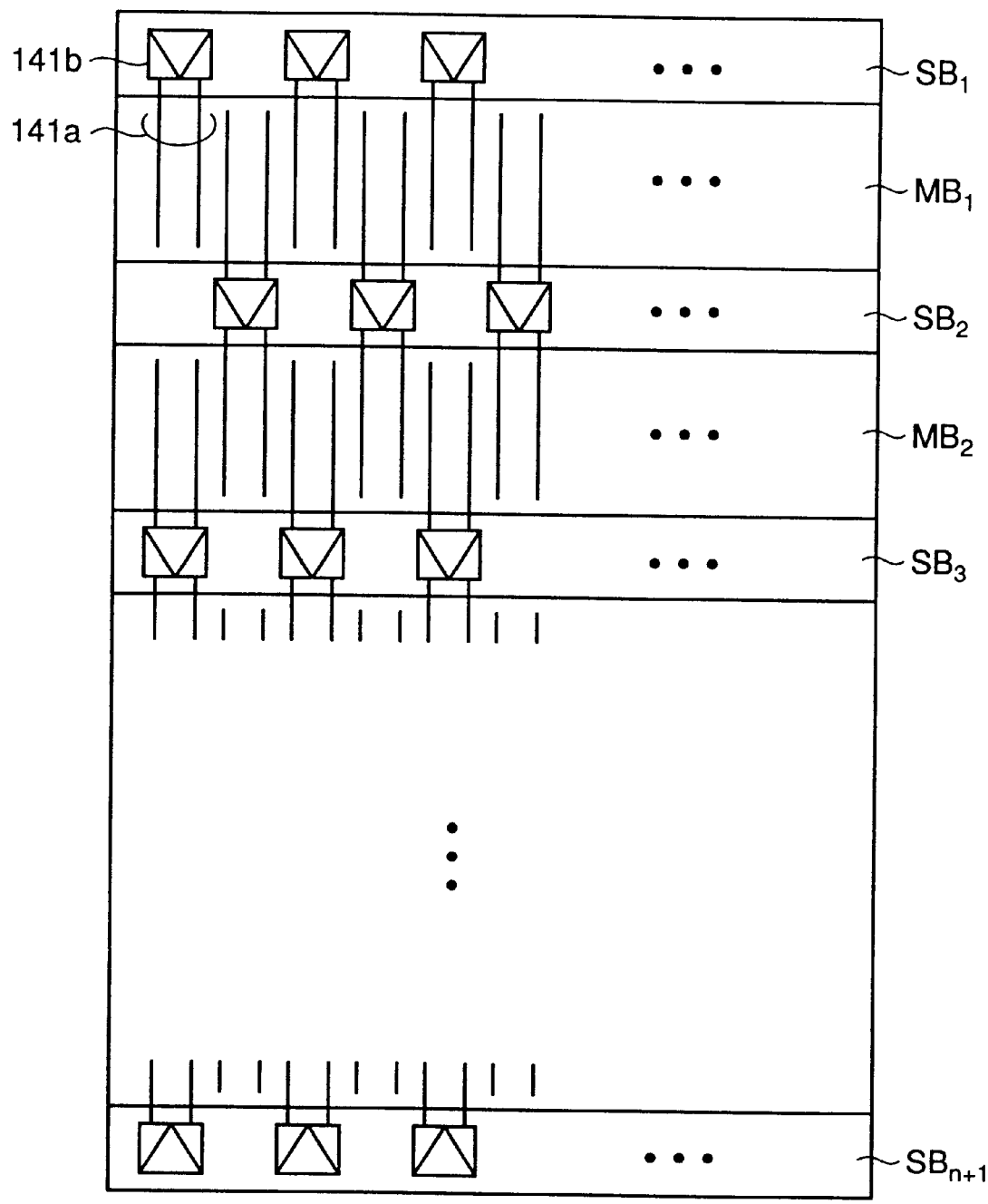
FIG. 3 is a block diagram illustrating a memory array in the DRAM contained LSI of the first embodiment of the invention.

FIG. 3 is a schematic view illustrating a structure of memory array 141. Referring to FIG. 3, memory array 141 includes a plurality of memory blocks $MB_1$–$MB_n$. Each memory block $MB_i$ (i=1–n) includes a plurality of pairs of bit lines 141a. Memory array 141 includes a plurality of sense amplifier bands $SB_1$–$SB_{n+1}$. Each sense amplifier band $SB_j$ (j=1–n+1) includes a plurality of sense amplifiers 141b. A sense amplifier band located between memory blocks is shared by memory blocks on both sides thereof. In other words, memory array 141 employs a so-called shared sense amplifier structure.

Figure 4:
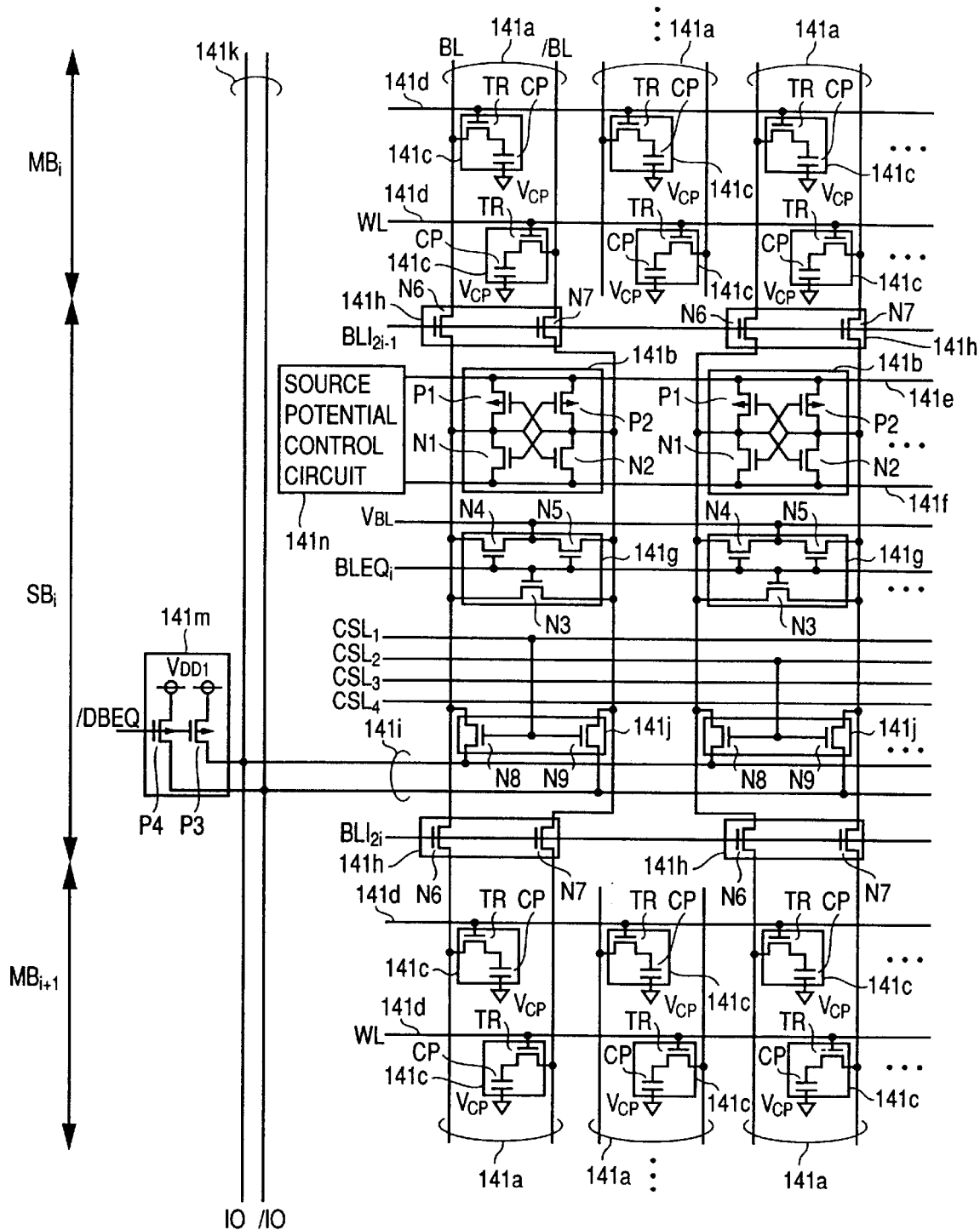
FIG. 4 is a circuit diagram illustrating the memory array in the DRAM contained LSI of the first embodiment of the invention.

FIG. 4 is a circuit diagram partially showing memory array 141. Referring to FIG. 4, memory blocks $MB_i$ and $MB_{i+1}$ each include a plurality of memory cells 141c arranged in a plurality of rows and a plurality of columns. Memory blocks $MB_i$ and $MB_{i+1}$ each further include a plurality of word lines 141d arranged in a plurality of associated rows and each word line is connected to memory cells 141c arranged in an associated row. Word line 141d is connected to row decoder 142 shown in FIG. 2. Row decoder 142 selects word line 141d according to a row address signal, and boosted potential $V_{PP}$ is applied to the selected word line 141d. Boosted potential $V_{PP}$ set at 3.0V, for example, is generated by internal potential generating circuit 160 in FIG. 2 and supplied to row decoder 142.

Memory blocks $MB_i$ and $MB_{i+1}$ each further include a plurality of pairs of bit lines 141a arranged in a plurality of associated columns and each bit line pair is connected to memory cells 141c arranged in an associated column. Each memory cell 141c includes a memory capacitor CP having one electrode receiving cell plate potential $V_{CP}$ which is intermediate potential $(V_{DD1}+V_{SS})/2$ between supply potentials $V_{DD1}$ and $V_{SS}$. Cell plate potential $V_{CP}$ is generated by internal potential generating circuit 160. Each memory cell 141c further includes an N channel memory transistor TR connected between the other electrode of memory capacitor CP and a bit line of an associated pair of bit lines 141a.

Sense amplifier band $SB_i$ includes a plurality of sense amplifiers 141b. Each of sense amplifiers 141b is shared by bit line pairs 141a in memory blocks $MB_i$ and $MB_{i+1}$ and is connected to an associated pair of bit lines 141a. Each of sense amplifiers 141a is connected to common source lines 141e and 141f. Each sense amplifier 141b amplifies potential on one bit line of the bit line pair 141a connected thereto to potential on common source line 141e, and amplifies potential on the other bit line to potential on common source line 141f.

Sense amplifier 141b includes P channel MOS transistors P1 and P2 constituting a P channel sense amplifier of a cross-coupled type. P channel MOS transistors P1 and P2 have sources connected to common source line 141e. The P channel sense amplifier amplifies potential on one bit line of bit line pair 141a connected thereto to potential on common source line 141e. Sense amplifier 141b includes N channel MOS transistors N1 and N2 constituting an N channel sense amplifier of the cross-coupled type. The sources of N channel MOS transistors N1 and N2 are connected to common source line 141f. The N channel sense amplifier amplifies potential on the other bit line of bit line pair 141a connected thereto to potential on common source line 141f.

Sense amplifier band $SB_i$ includes a plurality of bit line equalizers 141g. Each of bit line equalizers 141g is shared by bit line pairs 141a in memory blocks $MB_i$ and $MB_{i+1}$ and connected to an associated bit line pair 141a as sense amplifier 141b. Each of bit line equalizers 141g receives precharge potential $V_{BL}$ and bit line equalize signal $BLEQ_i$, equalizes potential on each bit line of bit line pair 141a in response to bit line equalize signal $BLEQ_i$, and precharges it to precharge potential $V_{BL}$.

Bit line equalizer $141_g$ includes an N channel MOS transistor N3 for equalizing potentials on bit lines included in associated bit line pair 141a. Bit line equalizer 141g further includes N channel MOS transistors N4 and N5 for precharging potentials on the bit lines included in associated bit line pair 141a to precharge potential $V_{BL}$. The gates of N channel MOS transistors N3, N4 and N5 receive bit line equalize signal $BLEQ_i$.

Sense amplifier band $SB_i$ further includes a plurality of pairs of N channel transistors 141h connected between bit line pair 141a in memory block $MB_i$ and sense amplifier 141b and between bit line pair 141a in memory block $MB_{i+1}$ and sense amplifier 141b. N channel transistor pair 141h responds to bit line isolation signal $BLI_{2i-1}$ or $BLI_{2i}$ to connect associated pair of bit lines 141a to sense amplifier 141b and bit line equalizer 141g and disconnect associated bit line pair 141a from sense amplifier 141b and bit line equalizer 141g.

Each N channel transistor pair 141h includes N channel MOS transistors N6 and N7. The gates of N channel MOS transistors N6 and N7 receive bit line isolation signal $BLI_{2i-1}$ or $BLI_{2i}$. The bit line isolation signal is generated by row decoder 142 and selectively set at a low level (supply potential $V_{SS}$) in response to a row address signal. The level of the bit line isolation signal oscillates between boosted potential $V_{PP}$ and supply potential $V_{SS}$.

Sense amplifier band $SB_i$ further includes a plurality of transfer gates 141j connected between bit line pair 141a and local data bus 141i. In response to column selection signals $CSL_1$–$CSL_4$ supplied from column decoder 143, transfer gates 141j selectively and electrically connect one of four pairs of bit lines associated with adjacent four sense amplifiers 141b in memory block $MB_i$ or $MB_{i+1}$ to local data bus 141i. Each transfer gate 141j includes N channel MOS transistors N8 and N9. The gates of N channel MOS transistors N8 and N9 receive any of column selection signals $CSL_1$–$CSL_4$. The amplitude of column selection signals $CSL_1$–$CSL_4$ corresponds to $V_{DD3}$–$V_{SS}$.

Local data bus 141i includes a pair of I/O lines. One local data bus 141i is shared by four sense amplifiers 141b adjacent to each other. In other words, local data bus 141i is shared by four pairs of bit lines 141a in memory block $MB_i$. Local data bus 141i is also shared by four pairs of bit lines 141a in memory block $MB_{i+1}$. Local data bus 141i extends along word line 141d.

Global data bus 141k is commonly connected to a plurality of local data buses 141i in a plurality of sense amplifier bands $SB_i$. Global data bus 141k includes a pair of I/O lines. Global data bus 141k extends over a plurality of memory blocks along bit line pair 141a. In write operation, write data is supplied from global data bus 141k and local data bus 141i to bit line pair 141a via transfer gate 141j in the conductive state.

Memory array 141 includes a data bus precharge circuit 141m connected to local data bus 141i and global data bus 141k. Data bus precharge circuit 141m responds to data bus equalize signal /DBEQ to precharge data buses 141i and 141k to supply potential $V_{DD1}$, and stops the precharging of data buses 141i and 141k in read operation and write operation. Data bus precharge circuit 141m includes a pair of P channel transistors P3 and P4 connected to a power supply line to which supply potential $V_{DD1}$ is applied and data buses 141i and 141k. The gates of P channel transistors P3 and P4 receive data bus equalize signal /DBEQ. Data bus equalize signal /DBEQ is generated by command decoder 110 and set at a high level (supply potential $V_{DD3}$) of an inactive state when the read operation and the write operation are requested. When the refresh operation is requested, the data bus equalize signal is kept at low level (supply potential $V_{SS}$) of an active state.

Sense amplifier band $SB_i$ includes a source potential control circuit 141n connected to common source lines 141e and 141f. When an internal control signal from command decoder 110 indicates that the write operation is requested, source potential control circuit 141n responds to this and applies supply potential $V_{DD2}$ lower than supply potential $V_{DD1}$ to common source line 141e. After write data is supplied to bit line pair 141a, source potential control circuit 141n applies supply potential $V_{DD1}$ to common source line 141e. When read operation or refresh operation, not the write operation, is requested, source potential control circuit 141n does not apply supply potential $V_{DD2}$ to common source line 141e and applies only supply potential $V_{DD1}$ thereto.

Source potential control circuit 141n applies ground potential $V_{SS}$ to common source line 141f in all of the read, write and refresh operations. Source potential control circuit 141n equalizes and precharges potentials on common source lines 141e and 141f to precharge potential $V_{BL}$ when potential on bit line pair 141a is equalized/precharged.

Figure 5:
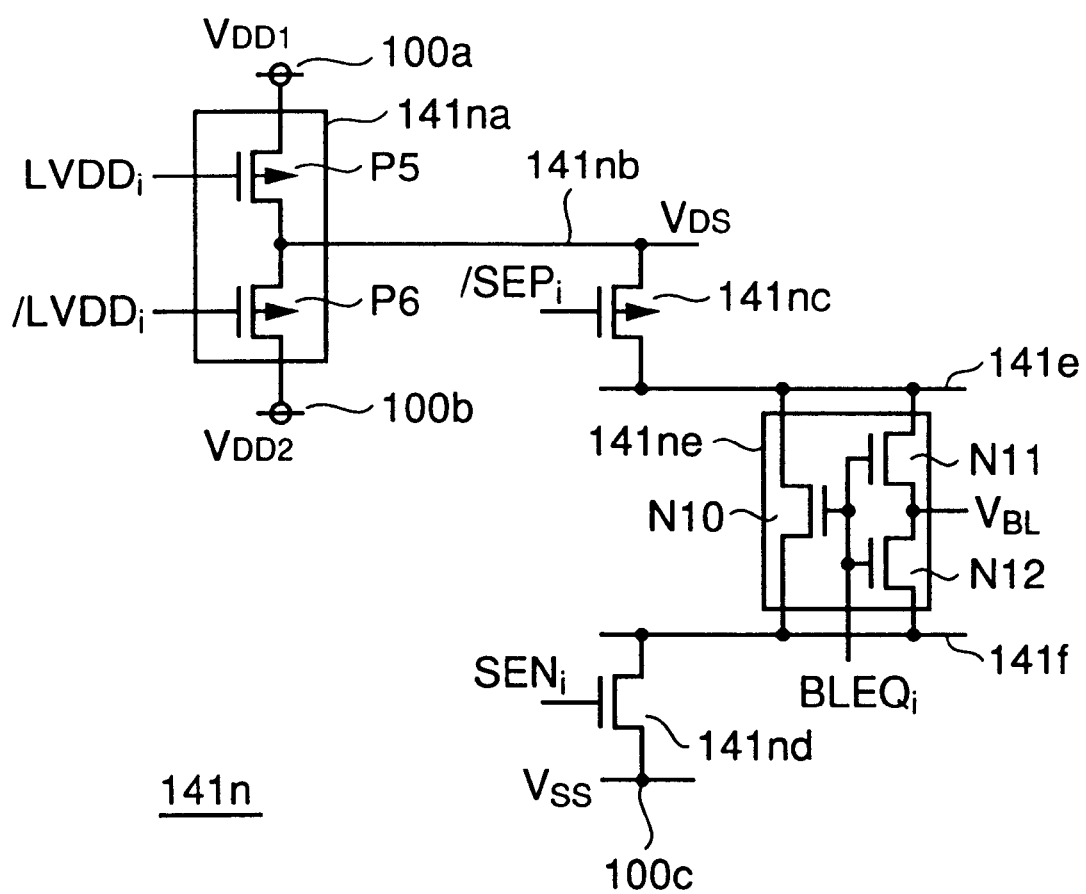
FIG. 5 is a circuit diagram illustrating a source potential control circuit in the DRAM contained LSI of the first embodiment of the invention.

FIG. 5 is a circuit diagram illustrating source potential control circuit 141n. Referring to FIG. 5, source potential control circuit 141n includes a potential switch 141na connected to a power supply node 100a receiving supply potential $V_{DD1}$ and to a power supply node 100b receiving supply potential $V_{DD2}$. Potential switch 141na responds to potential lowering signal $LVDD_i$ to apply one of supply potentials $V_{DD1}$ and $V_{DD2}$ to a sense power supply line 141nb. Potential lowering signals $LVDD_i$ and $/LVDD_i$ are complementary to each other. Potential lowering signals $LVDD_i$ and $/LVDD_i$ are supplied from command decoder 110 and the amplitude thereof corresponds to $V_{DD3}$–$V_{SS}$. Potential lowering signals $LVDD_i$ and $/LVDD_i$ respond to a command supplied to command decoder 110. Potential switch $141_{na}$ includes P channel transistors P5 and P6.

In response to a write operation request, potential lowering signals $LVDD_i$ and $/LVDD_i$ attain respectively high level and low level. Accordingly, supply potential $V_{DD2}$ lower than supply potential $V_{DD1}$ is applied to sense power supply line 141nb which is charged to supply potential $V_{DD1}$. In other words, potential switch 141na disconnects power supply node 100a from sense power supply line 141nb in response to the write operation request. When write data is thereafter supplied to bit line pair 141a, potential lowering signals $LVDD_i$ and $/LVDD_i$ respectively attain low level and high level before selected word line 141d is reset. In this way, supply potential $V_{DD1}$ is applied to sense power supply line 141nb.

When a request of read operation or refresh operation is issued, potential lowering signals $LVDD_i$ and $/LVDD_i$ are respectively maintained at low and high levels. Accordingly, transistor P5 is still turned on and transistor P6 is still turned off so that only supply potential $V_{DD1}$ is continuously applied to sense power supply line 141nb.

Source potential control circuit 141n further includes a P channel transistor 141nc connected between sense power supply line 141nb and common source line 141e. The gate of P channel transistor 141nc receives P channel sense amplifier enable signal/SEP$_i$. Source potential control circuit 141n further includes an N channel transistor 141nd connected between a power supply node 100c receiving supply potential (ground potential) $V_{SS}$ and common source line 141f. The gate of N channel transistor 141nd receives N channel sense amplifier enable signal SEN$_i$.

Source potential control circuit 141n further includes a source line equalizer 141ne connected to common source lines 141e and 141f. In response to bit line equalize signal BLEQ$_i$, source line equalizer 141ne equalizes potentials on common source lines 141e and 141f and precharges common source lines 141e and 141f to precharge potential $V_{BL}$. Source line equalizer 141ne includes an N channel MOS transistor N10 for equalization. Source line equalizer 141ne further includes N channel MOS transistors N11 and N12 for precharging. The gates of N channel MOS transistors N10, N11 and N12 receive bit line equalize signal BLEQ$_i$.

Figure 6:
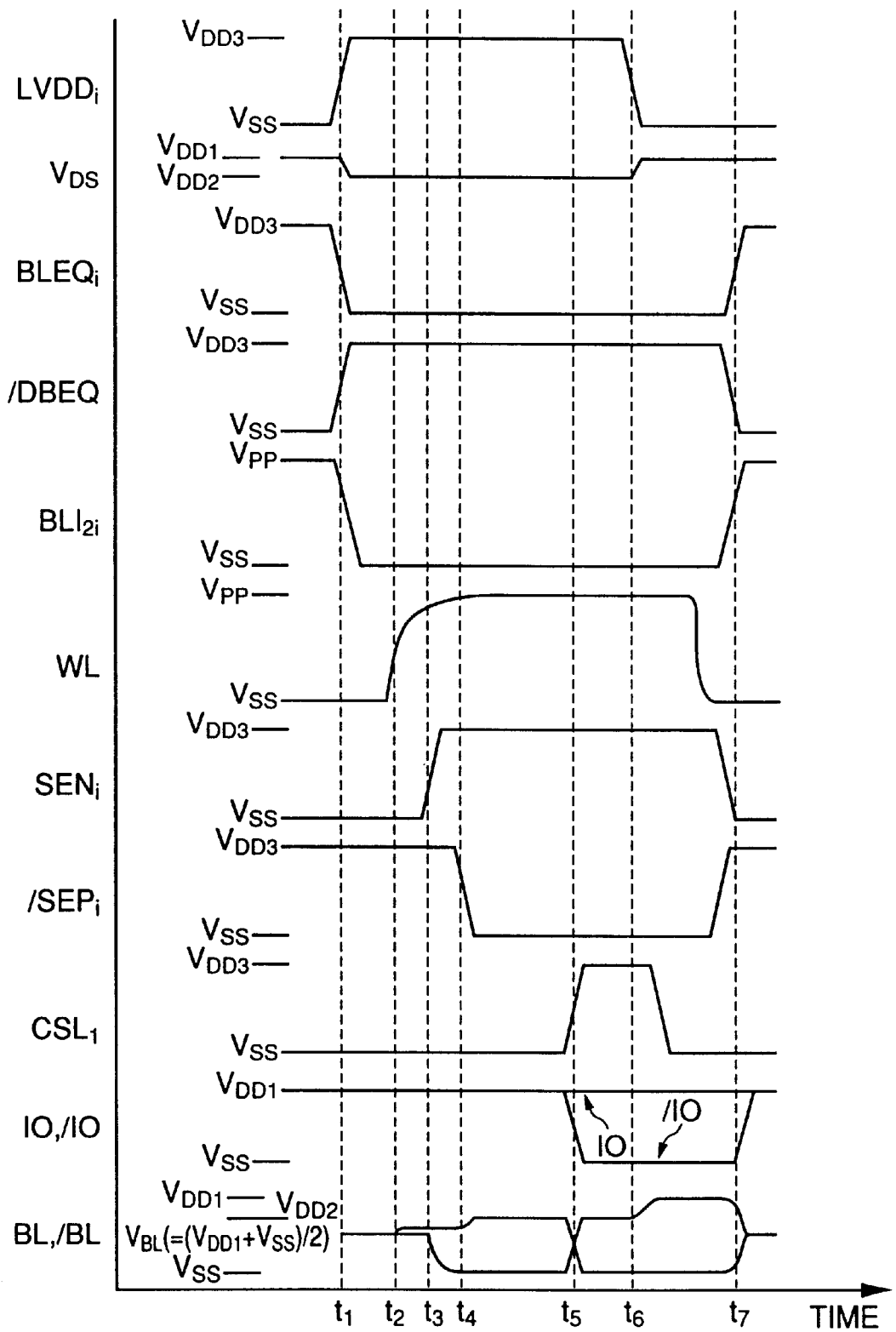
FIG. 6 is a timing chart illustrating a write operation in the DRAM in the DRAM contained LSI of the first embodiment of the invention.

An operation is next described. FIG. 6 is a timing chart illustrating write operation. Here, writing into memory cell 141c on the lower left part of memory block MB$_i$ (see FIG. 4) is described. In FIG. 6, write data of low level is written into the memory cell in which data of high level is stored. In the standby period preceding time $t_1$ at which write operation is requested, bit line equalize signal BLEQ$_i$ is set at high level ($V_{DD3}$). Potentials BL and /BL on bit lines constituting the bit line pair 141a are respectively precharged and equalized to precharge potential $V_{BL}$ by bit line equalizer 141g.

At this time, bit line equalize signal BLEQ$_i$ is at high level and sense amplifier enable signals SEN$_i$ and /SEN$_i$ are respectively at inactive low level and high level, so that potentials on common source lines 141e and 141f are precharged and equalized to precharge potential $V_{BL}$ by source line equalizer 141ne. As potential lowering signal LVDD$_i$ is set at inactive low level, sense power supply potential $V_{DS}$ on sense power supply line 141nb is at power supply potential $V_{DD1}$. Further, as data bus equalize signal /DBEQ is at active low level, potentials IO and /IO on global data bus 141k and local data bus 141i are precharged and equalized to power supply potential $V_{DD1}$.

In response to write operation request, potential lowering signal LVDD$_i$ changes to active high level ($V_{DD3}$) at time $t_1$. Accordingly, potential $V_{DS}$ on sense power supply line 141nb changes to supply potential $V_{DD2}$. When bit line equalize signal BLEQ$_i$ changes to inactive low level, equalizing and precharging of bit line pair 141a and common source lines 141e and 141f are stopped. When data bus equalize signal/DBEQ changes to inactive high level ($V_{DD3}$), equalizing and precharging of global data bus 141k and local data bus 141i are stopped.

When bit line isolation signal BLI$_{2i}$ changes to low level, bit line pair 141a included in memory block MB$_{i+1}$ is disconnected from sense amplifier 141b and bit line equalizer 141g. Since bit line isolation signal BLI$_{2i-1}$ remains at high level ($V_{PP}$), bit line pair 141a included in memory block MB$_i$ is electrically connected to sense amplifier 141b.

At time $t_2$, the downmost one of a plurality of word lines 141d included in memory block MB$_i$ (see FIG. 4) is selected.

Potential WL on the selected word line 141d changes from inactive low level ($V_{SS}$) to active high level ($V_{PP}$). Accordingly, charges are transported from memory cell 141c connected to the selected word line 141d to a bit line of bit line pair 141a connected to memory cell 141c, and accordingly potential/BL on this bit line slightly increases from precharge potential $V_{BL}$.

At time $t_3$, N channel sense amplifier enable signal SEN$_i$ attains high level ($V_{DD3}$) indicating enable of the N channel sense amplifier. Accordingly, common source line 141f and power supply node 100c receiving supply potential $V_{SS}$ become conductive and potential on common source line 141f changes to supply potential $V_{SS}$. Accordingly, the N channel sense amplifier constituted of transistors N1 and N2 of sense amplifier 141b is enabled and potential BL on the bit line is reduced to the potential on common source line 141f. Consequently, potential BL on the bit line changes to supply potential $V_{SS}$.

At time $t_4$, P channel sense amplifier enable signal /SEP$_i$ reaches low level indicating enable of the P channel sense amplifier. Accordingly, common source line 141e and sense power supply line 141nb become conductive and potential $V_{DS}$ on sense power supply line 141nb or supply potential $V_{DD2}$ is applied to common source line 141e. The P channel sense amplifier constituted of transistors P1 and P2 of sense amplifier 141b is thus enabled and potential /BL on the bit line is accordingly increased to the potential on common source line 141e. As a result, potential/BL on the bit line changes to supply potential $V_{DD2}$.

At time $t_5$, column selection signal CSL$_1$ attains active high level ($V_{DD3}$). Other column selection signals CSL$_2$–CSL$_4$ are kept at inactive low level. On the other hand, when write data is transmitted to global data bus 141k and local data bus 141i, potentials IO and /IO of I/O lines constituting the data bus respectively attain high level and low level. In this way, the write data is transmitted from local data bus 141i to bit line pair 141a via transfer gate 141j. As a result, potentials BL and /BL on the bit lines are respectively inverted to high level ($V_{DD2}$) and low level ($V_{SS}$).

When potential lowering signal LVDD$_i$ changes to inactive low level at time $t_6$, sense power supply line 141nb in FIG. 5 is connected to supply node 100a to which supply potential $V_{DD1}$ is applied. Accordingly, supply potential $V_{DD1}$ is applied to common source line 141e. Consequently, potential BL on the bit line changes from supply potential $V_{DD2}$ to supply potential $V_{DD1}$.

After this, potential WL on selected word line 141d is reset to low level and accordingly supply potential $V_{SS}$ is stored in capacitor CP of memory cell 141c. At time $t_7$, bit line equalize signal BLEQ$_i$ attains high level so that potentials BL and /BL on bit lines are precharged and equalized to precharge potential $V_{BL}$ by bit line equalizer 141g. On the other hand, data bus equalize signal /DBEQ attains low level so that potentials IO and /IO respectively on global and local data buses 141k and 141i are precharged and equalized to supply potential $V_{DD1}$.

Figure 7:
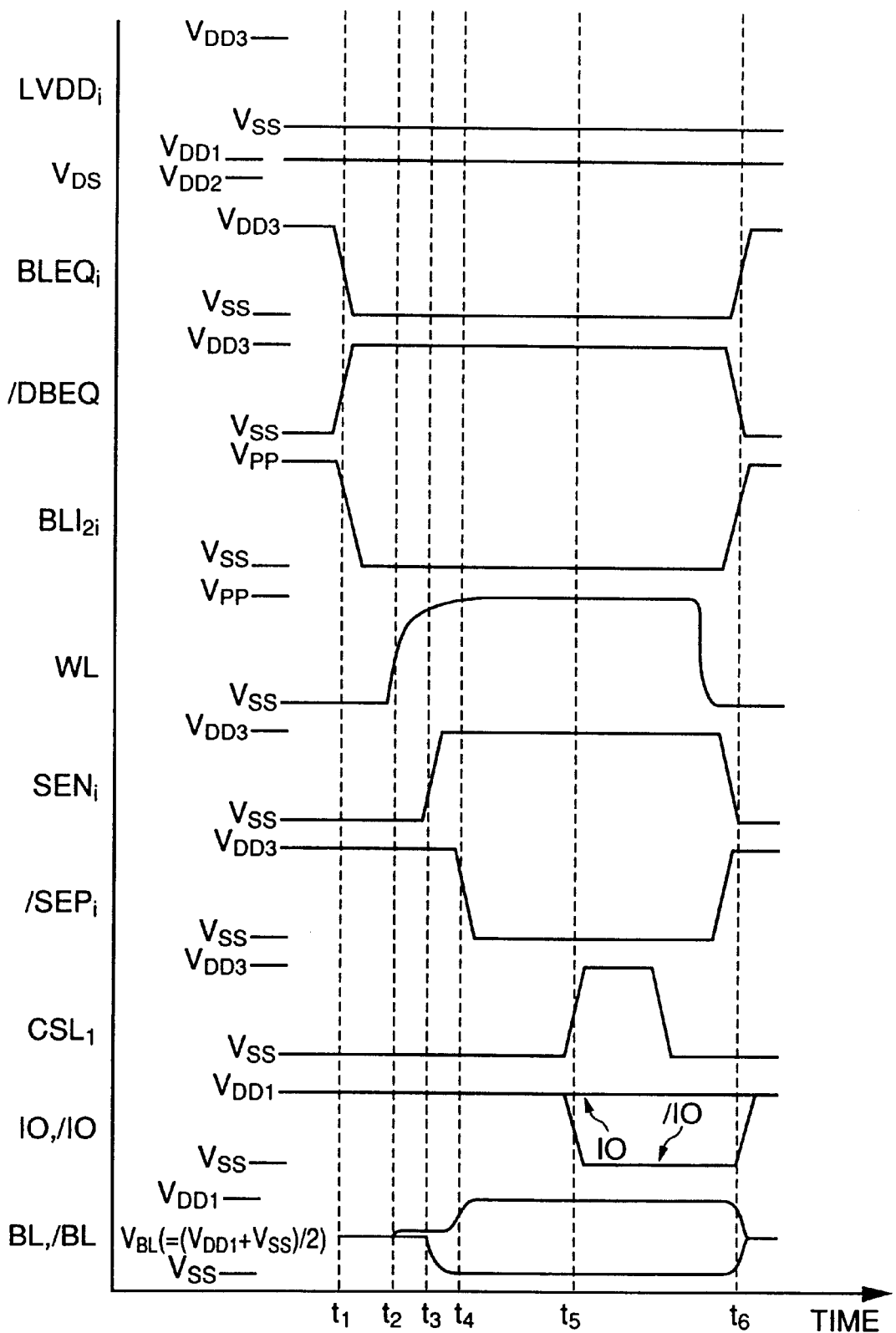
FIG. 7 is a timing chart illustrating a read operation in the DRAM in the DRAM contained LSI of the first embodiment of the invention.

FIG. 7 is a timing chart illustrating read operation. In FIG. 7, data of high level stored in memory cell 141c of memory block MB$_i$ on the lower left side (see FIG. 4) is read. In the read operation, potential lowering signal LVDD$_i$ stays at low level ($V_{DD3}$). Potential on sense supply line 141nb is thus kept at supply potential $V_{DD1}$. In response to read operation request, bit line equalize signal BLEQ$_i$ attains inactive low level at time $t_1$. Then equalizing and precharging of bit line pair 141a, and common source lines 141e and 141f are stopped. When data bus equalize signal /DBEQ attains inactive high level ($V_{DD3}$), equalizing and precharging of global data bus 141k and local data bus 141i are stopped.

When bit line isolation signal $BLI_{2i}$ changes to low level, bit line pair 141a in memory block $MB_{i+1}$ is disconnected from sense amplifier 141b and bit line equalizer 141g. Since bit line isolation signal $BLI_{2i-1}$ is kept at high level ($V_{PP}$), bit line pair 141a in memory block $MB_i$ is electrically connected to sense amplifier 141b.

At time $t_2$, among a plurality of word lines 141d in memory block $MB_i$, the downmost word line 141d (see FIG. 4) is selected. Potential WL on selected word line 141d changes from inactive low level ($V_{SS}$) to active high level ($V_{PP}$). Accordingly, charges move from memory cell 141c connected to selected word line 141d to a bit line of bit line pair 141a to which memory cell 141c is connected. Consequently, potential /BL on this bit line slightly increases from precharge potential $V_{BL}$.

At time $t_3$, N channel sense amplifier enable signal $SEN_i$ attains high level ($V_{DD3}$) which indicates enable of the N channel sense amplifier. Accordingly, common source line 141f and power supply node 100c receiving supply potential $V_{SS}$ become conductive and potential on common source line 141f changes to supply potential $V_{SS}$. In response to this, the N channel sense amplifier formed of transistors N1 and N2 of sense amplifier 141b is enabled to decrease potential BL on the bit line to the potential on common source line 141f. As a result, potential BL on the bit line changes to supply potential $V_{SS}$.

At time $t_4$, P channel sense amplifier enable signal $/SEP_i$ changes to the low level indicating enable of the P channel sense amplifier. Accordingly, common source line 141e and sense power supply line 141nb become conductive and common source line 141e receives potential $V_{DS}$ on sense power supply line 141nb, i.e. supply potential $V_{DD1}$. The P channel sense amplifier formed of transistors P1 and P2 of sense amplifier 141b is enabled so that potential /BL on the bit line increases to the potential on common source line 141e. As a result, potential /BL on the bit line changes to supply potential $V_{DD1}$.

At time $t_5$, column selection signal $CSL_1$ attains active high level ($V_{DD3}$). Other column selection signals $CSL_2$–$CSL_4$ are kept at inactive low level. Potential on bit line pair 141a amplified by sense amplifier 141b is transmitted to local data bus 141i and global data bus 141k via transfer gate 141j. Consequently, potentials IO and /IO on the I/O lines which constitute the data bus attain respectively at low and high levels. In this way, read data is output to global data bus 141k.

Potential WL on selected word line 141d is thereafter reset to low level so that supply potential $V_{DD1}$ is stored in capacitor CP of memory cell 141c. At time $t_6$, bit line equalize signal $BLEQ_i$ attains high level so that potentials BL and /BL on the bit lines are precharged and equalized to precharge potential $V_{BL}$ by bit line equalizer 141g. On the other hand, data bus equalize signal/DBEQ reaches low level so that potentials IO and /IO on the I/O lines of global and local data buses 141k and 141i are precharged and equalized to supply potential $V_{DD1}$.

Figure 8:
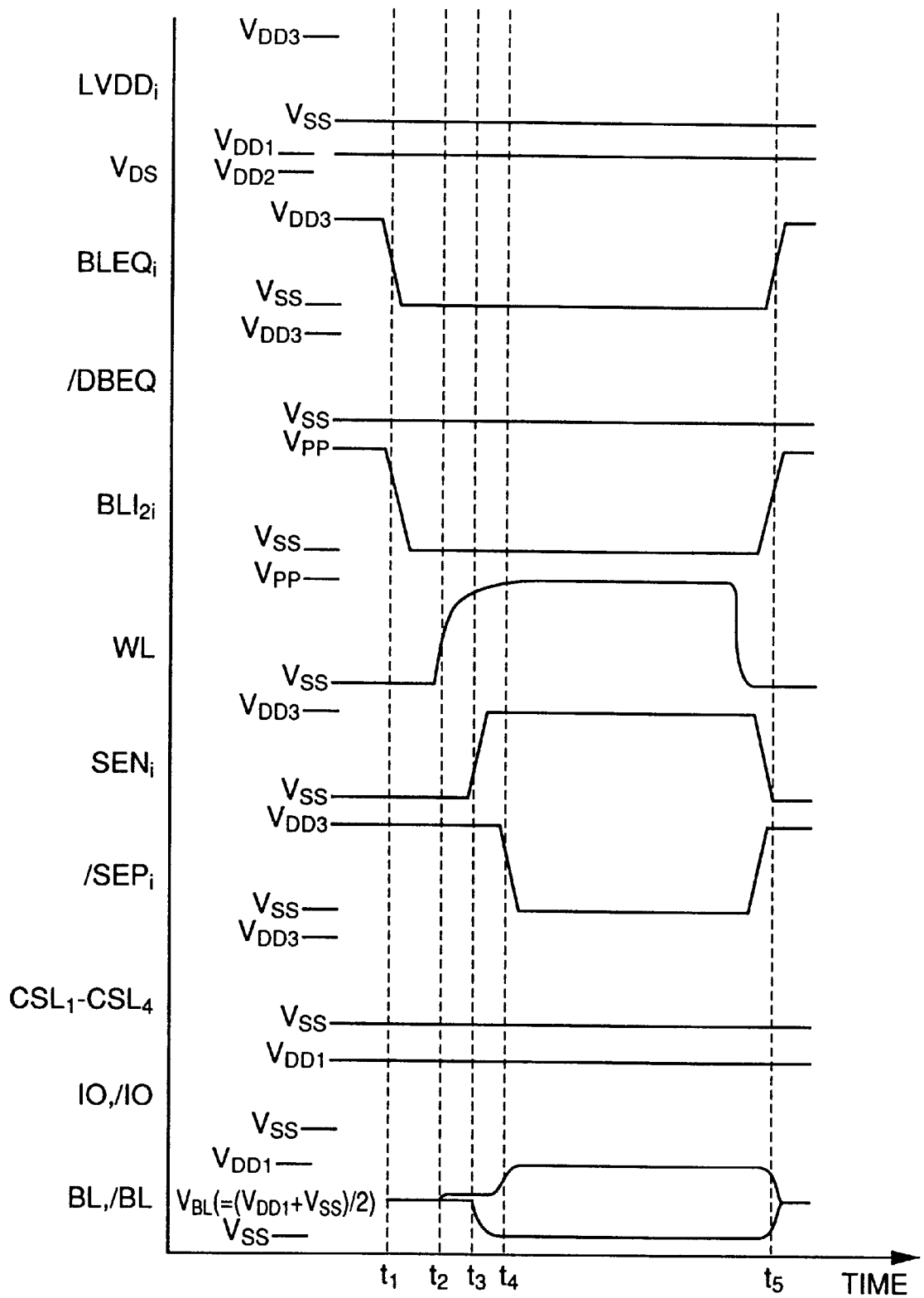
FIG. 8 is a timing chart illustrating a refresh operation in the DRAM in the DRAM contained LSI of the first embodiment of the invention.

FIG. 8 is a timing chart illustrating refresh operation. In FIG. 8, high level data is stored in the downmost memory cell 141c of memory block $MB_i$ (see FIG. 4) and the row of memory cell 141c is refreshed. In the refresh operation, potential lowering signal $LVDD_i$ is kept at low level ($V_{DD3}$) as in the read operation. Potential on sense power supply line 141nb is thus kept at supply potential $V_{DD1}$. In addition, data bus equalize signal /DBEQ stays at low level. Accordingly, potentials IO and /IO on global data bus 141k and local data bus 141i are still equalized and precharged to supply potential $V_{DD1}$. Column selection signals $CSL_1$–$CSL_4$ all stay at inactive low level.

In response to refresh operation request, at time $t_1$, bit line equalize signal $BLEQ_i$ reaches inactive low level so that equalizing and precharging of bit line pair 141a and common source lines 141e and 141f are stopped. Further, when bit line isolation signal $BLI_{2i}$ changes to low level, bit line pair 141a in memory block $MB_{i+1}$ is disconnected from sense amplifier 141b and bit line equalizer 141g. Since bit line isolation signal $BLI_{2i-1}$ is still at high level ($V_{PP}$), bit line pair 141a in memory block $MB_i$ is electrically connected to sense amplifier 141b.

At time $t_2$, among a plurality of word lines 141d in memory block $MB_i$, the downmost word line 141d (see FIG. 4) is selected. Potential WL on selected word line 141d changes from inactive low level ($V_{SS}$) to active high level ($V_{PP}$). Accordingly, charges move from memory cell 141c connected to selected word line 141d to the bit line of bit line pair 141a to which memory cell 141c is connected so that potential /BL on this bit line slightly increases from precharge potential $V_{BL}$.

At time $t_3$, N channel sense amplifier enable signal $SEN_i$ attains high level ($V_{DD3}$) indicating enable of the N channel sense amplifier. Accordingly, common source line 141f and supply node 100c receiving supply potential $V_{SS}$ become conductive so that potential on common source line 141f changes to supply potential $V_{SS}$. In response to this, the N channel sense amplifier constituted of transistors N1 and N2 of sense amplifier 141b is enabled and potential BL on the bit line is decreased to the potential on common source line 141f. As a result, potential BL on the bit line changes to supply potential $V_{SS}$.

At time $t_4$, P channel sense amplifier enable signal/$SEP_i$ changes to low level indicating enable of the P channel sense amplifier. Accordingly, common source line 141e and sense supply line 141nb become conductive so that potential $V_{DS}$ on sense supply line 141nb, i.e. supply potential $V_{DD1}$ is applied to common source line 141e. In response to this, the P channel sense amplifier constituted of transistors P1 and P2 of sense amplifier 141b is enabled so that potential /BL on the bit line increases to potential on common source line 141e. As a result, potential /BL on the bit line changes to supply potential $V_{DD1}$.

After this, potential WL on selected word line 141d is reset to low level and supply potential $V_{DD1}$ is stored in capacitor CP of memory cell 141c. At time $t_5$, bit line equalize signal $BLEQ_i$ attains high level so that potentials BL and /BL on the bit lines are precharged and equalized to precharge potential $V_{BL}$ by bit line equalizer 141g.

As heretofore described, in the first embodiment, the high level of the bit line is set at $V_{DD2}$ which is lower than supply potential $V_{DD1}$ in the write operation. Consequently, when an inverted version of data stored in memory cell 141c is to be written, the bit line at high level which will be discharged in the future to low level when write data is supplied to the bit line pair is only charged to supply potential $V_{DD2}$ without charging it to supply potential $V_{DD1}$ higher than supply potential $V_{DD2}$. In this way, power consumption in the write operation is reduced.

In the read and refresh operations, the high level of the bit line is set at supply potential $V_{DD1}$ without setting it at supply potential $V_{DD2}$ which is not done in the write operation. Reduction of speed as required in the write operation is not necessary in the read and refresh operations. As a result, a DRAM with reduced power consumption in the write operation is achieved without decreasing the speed of the read and refresh operations.

In the first embodiment, when the write operation is requested, the high level of the bit line is always set at $V_{DD2}$ which is lower than supply potential $V_{DD1}$. However, a low consumption write command may newly be defined so as to set the high level of the bit line at $V_{DD2}$ lower than $V_{DD1}$ when the low consumption write command is input. When such a new low consumption write command is defined, a usual write operation is performed upon a normal write operation request.

Second Embodiment

Figure 9:
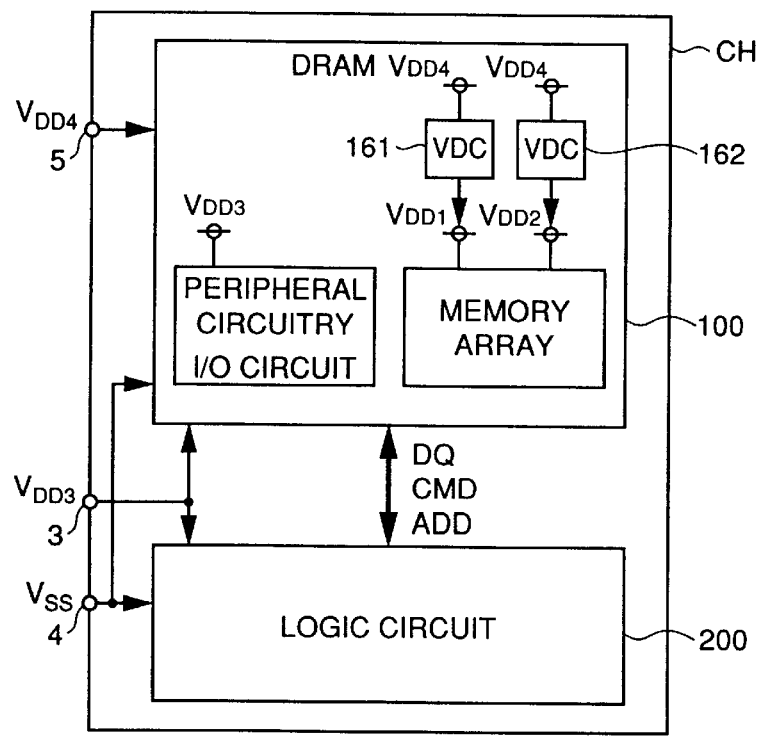
FIG. 9 is a block diagram illustrating a DRAM contained LSI of a second embodiment of the invention.

Another embodiment of the present invention is now described in conjunction with FIG. 9. A difference between a DRAM contained LSI in the second embodiment and the DRAM contained LSI in the first embodiment is that supply potentials $V_{DD1}$ and $V_{DD2}$ are applied from the outside of semiconductor chip CH via power supply pins 1 and 2 in the first embodiment while external supply potential $V_{DD4}$ is applied externally via a power supply pin 5 and supply potentials $V_{DD1}$ and $V_{DD2}$ are internally generated based on external supply potential $V_{DD4}$ in the second embodiment. There is no difference except for this between the first and second embodiments. This difference is described below.

FIG. 9 is a schematic block diagram illustrating the DRAM contained LSI presented for comparison with FIG. 1. Referring to FIG. 9, one power supply pin 5 in the DRAM contained LSI replaces two power supply pins 1 and 2 shown FIG. 1. External supply potential $V_{DD4}$ is applied to power supply pin 5. Supply potential $V_{DD4}$ is potential of 3.3V, for example. A DRAM 100 includes a voltage downconverter 161 which generates supply potential $V_{DD1}$ based on external supply potential $V_{DD4}$. DRAM 100 further includes a voltage downconverter 162 which receives external supply potential $V_{DD4}$ to generate supply potential $V_{DD2}$ based on external supply potential $V_{DD4}$. Other circuits are similar to those in the first embodiment. Voltage downconverters 161 and 162 are included in internal potential generating circuit 160 shown in FIG. 2.

Third Embodiment

Figure 10:
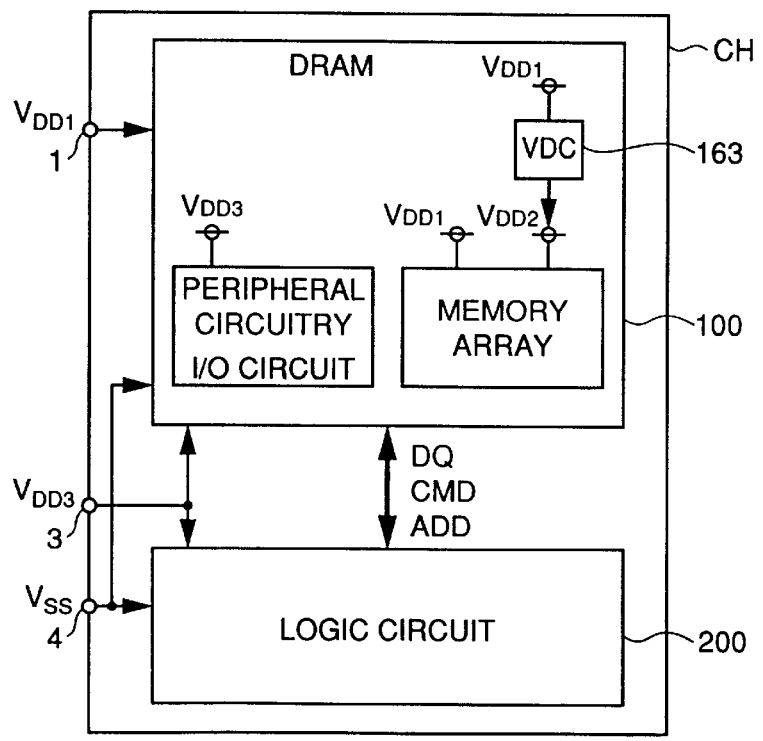
FIG. 10 is a block diagram illustrating a DRAM contained LSI of a third embodiment of the invention.

Still another embodiment of the invention is now described in conjunction with FIG. 10. A difference between a DRAM contained LSI in the third embodiment and that in the second embodiment is that external supply potential $V_{DD4}$ is applied externally via power supply pin 5 to internally generate supply potentials $V_{DD1}$ and $V_{DD2}$ based on external supply potential $V_{DD4}$ in the second embodiment while a power supply pin 1 is used instead of power supply pin 5 as in the first embodiment and external supply potential $V_{DD1}$ is supplied from the outside of the chip via power supply pin 1 to internally generate supply potential $V_{DD2}$ based on external supply potential $V_{DD1}$. There is no difference except for this between the first and third embodiments. The difference is described below.

FIG. 10 is a schematic block diagram illustrating the DRAM contained LSI presented for comparison with FIG. 1 or FIG. 9. Referring to FIG. 10, the DRAM contained LSI employs power supply pin 1 instead of power supply pin 5 shown in FIG. 9. Power supply pin 2 shown in FIG. 1 is not employed here. External supply potential $V_{DD1}$ is applied to power supply pin 1. A DRAM 100 includes a voltage downconverter 163 instead of voltage downconverters 161 and 162, which receives external supply potential $V_{DD1}$ to generate supply potential $V_{DD2}$ based on external supply potential $V_{DD1}$. Other circuits are similar to those in the first or second embodiment. Voltage downconverter 163 is included in internal potential generating circuit 160 in FIG. 2.

Fourth Embodiment

Figure 11:
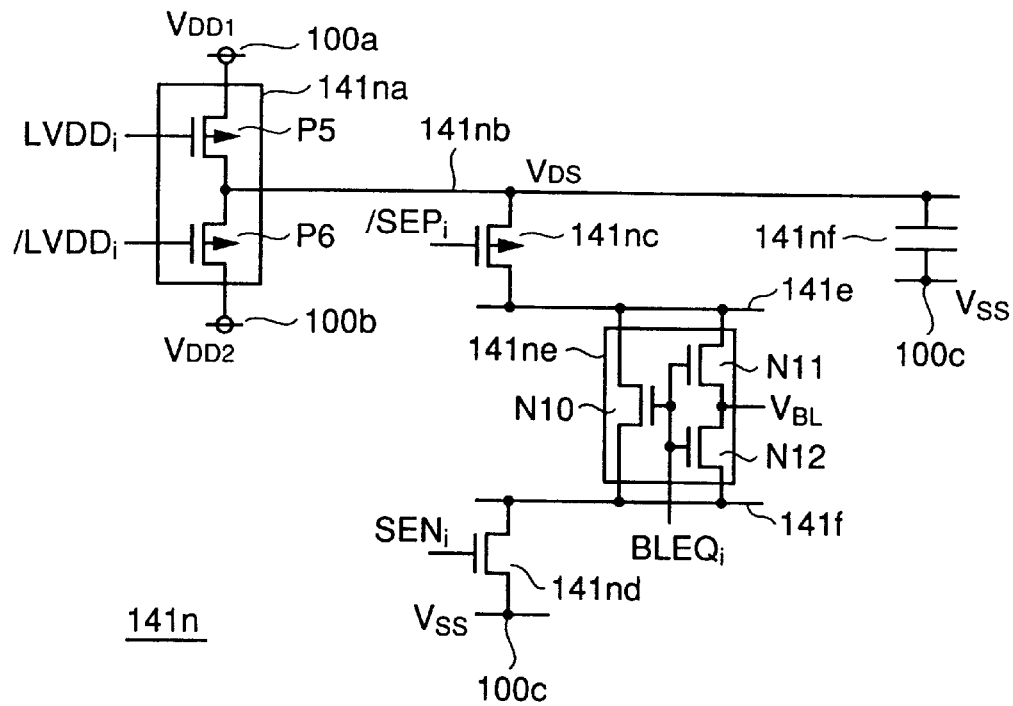
FIG. 11 is a circuit diagram illustrating a source potential control circuit in a DRAM contained LSI of a fourth embodiment of the invention.
Figure 12:
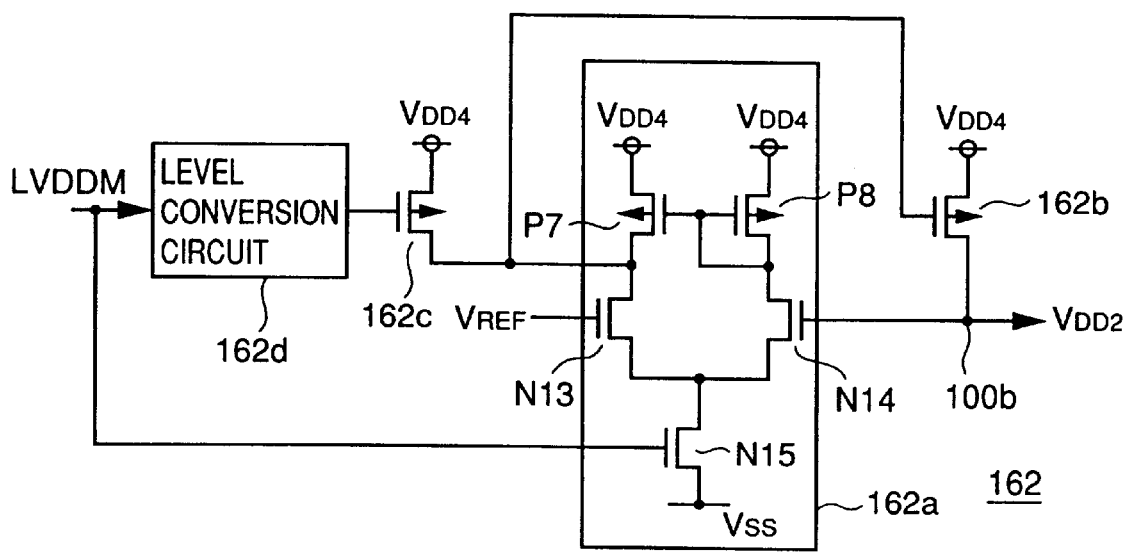
FIG. 12 is a circuit diagram illustrating a voltage down-converter in the DRAM contained LSI of the fourth embodiment of the invention.
Figure 13:
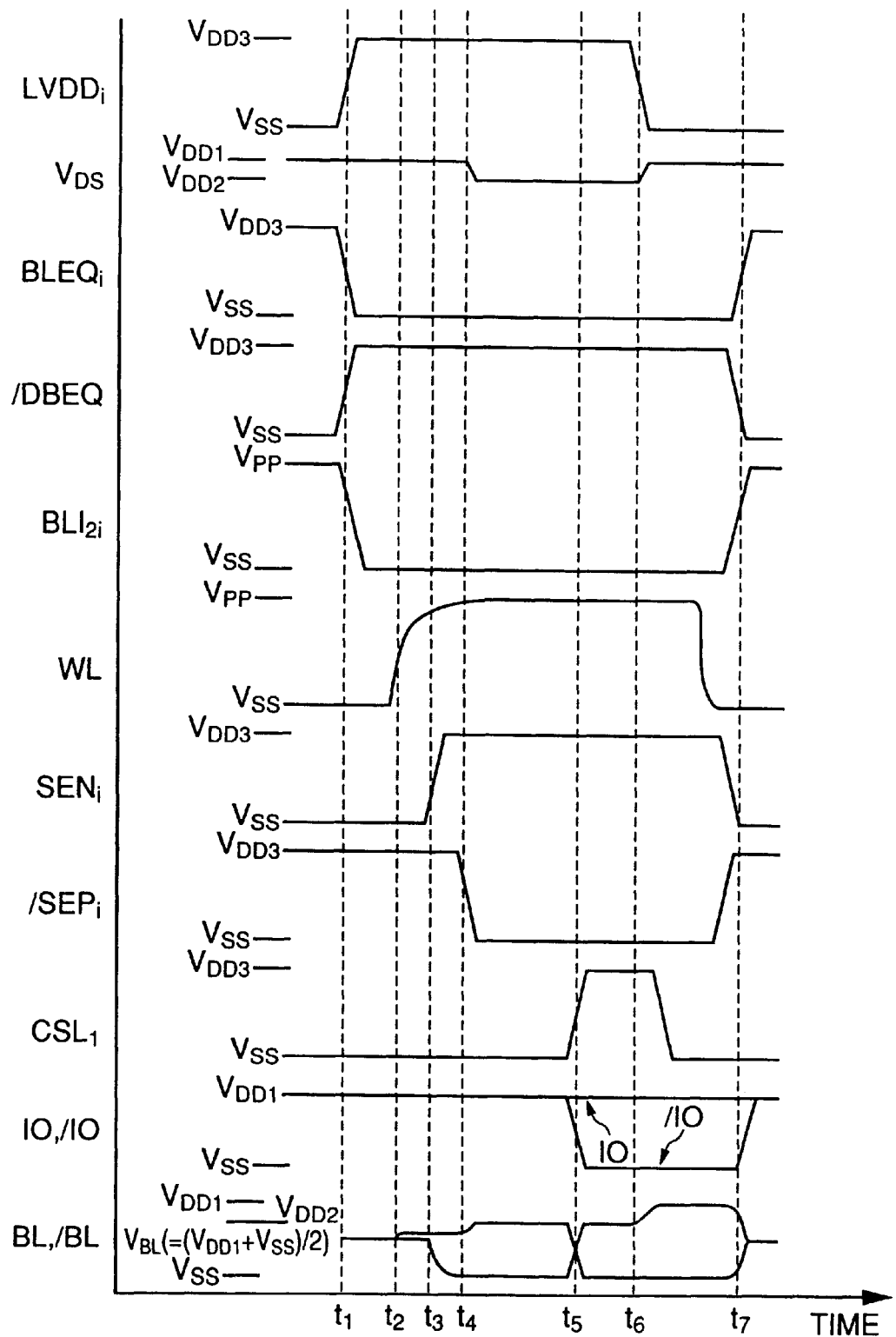
FIG. 13 is a timing chart illustrating a write operation in a DRAM in the DRAM contained LSI of the fourth embodiment of the invention.

A further embodiment of the invention is now described in conjunction with FIGS. 11 to 13. A difference between a DRAM contained LSI in the fourth embodiment and that in the second embodiment is the structure of source potential control circuit 141n.

FIG. 11 is a circuit diagram illustrating a source potential control circuit 141n. Referring to FIG. 11, source potential control circuit 141n includes a capacitor 141nf connected to a sense power supply line 141nb in addition to the circuit shown in FIG. 5. Capacitor 141nf represents a combination of a parasitic capacitance of sense power supply line 141nb and a capacitor formed as an element. The capacitor may be formed of an MOS capacitor or of a junction capacitance between a P type semiconductor substrate and an N well formed on the P type semiconductor substrate.

FIG. 12 is a circuit diagram illustrating a voltage downconverter 162. Referring to FIG. 12, voltage downconverter 162 includes a comparator 162a for comparing reference potential $V_{REF}$ of a set value of supply potential $V_{DD2}$ with supply potential $V_{DD2}$. Reference potential $V_{REF}$ is 1.5V, for example. Reference potential $V_{REF}$ is generated by internal potential generating circuit 160 shown in FIG. 2. Comparator 162a receives external supply potential $V_{DD4}$ to operate. In order to activate potential lowering signal $LVDD_j$, comparator 162a becomes active to make comparison when master potential lowering signal LVDDM, which is activated before activation of the potential lowering signal, attains active high level. Master potential lowering signal LVDDM is generated by command decoder 110 and the amplitude thereof is $V_{DD3}-V_{SS}$.

Comparator 162a outputs a low level signal in the active state if power supply potential $V_{DD2}$ is lower than reference potential $V_{REF}$. Comparator 162a outputs a high level signal in the active state if supply potential $V_{DD2}$ is higher than reference potential $V_{REF}$. Comparator 162a includes P channel transistors P7 and P8 and N channel transistors N13, N14 and N15.

Voltage downconverter 162 further includes a P channel driver transistor 162b connected between a node receiving external supply potential $V_{DD4}$ and a power supply node 100b which applies supply potential $V_{DD2}$. Driver transistor 162b receives output of comparator 162a at its gate. Voltage downconverter 162 further includes a level conversion circuit 162d which converts the amplitude of $V_{DD3}-V_{SS}$ of master potential lowering signal LVDDM to the amplitude of $V_{DD4}-V_{SS}$.

Voltage downconverter 162 further includes a P channel transistor 162c connected between a node receiving external supply potential $V_{DD4}$ and the gate of driver transistor 162b. P channel transistor 162c receives output of level conversion circuit 162d at its gate, becomes conductive when master potential lowering signal LVDDM reaches low level and thus turns off driver transistor 162b. When master potential lowering signal LVDDM is at low level, driver transistor 162b is turned off regardless of the relation between supply potential $V_{DD2}$ and reference potential $V_{REF}$. On the other hand, when master potential lowering signal LVDDM is at high level, driver transistor 162b is turned on if supply potential $V_{DD2}$ is lower than reference potential $V_{REF}$ and turned off if supply potential $V_{DD2}$ is higher than reference potential $V_{REF}$.

FIG. 13 is a timing chart illustrating write operation presented for comparison with FIG. 6. In the write operation shown in FIG. 13, even if potential lowering signal LVDD$_i$ attains high level and accordingly power supply node 100b and sense power supply line 141nb are electrically connected, potential V$_{DS}$ on sense power supply line 141nb is charged to supply potential V$_{DD1}$ and thus higher than reference potential V$_{REF}$ at this time. Accordingly, driver transistor 162b in voltage downconverter 162 is still turned off and potential V$_{DS}$ on sense power supply line 141nb is kept at the level of supply potential V$_{DD1}$.

At time t$_4$, common source line 141e and sense power supply line 141nb are connected and charges move from capacitor 141nf connected to sense power supply line 141nb to common source line 141e. Potential V$_{DS}$ on sense power supply line 141nb thus becomes lower than supply potential V$_{REF}$ and supply potential V$_{DD2}$ also becomes lower than reference potential V$_{REF}$ with potential V$_{DS}$. Consequently, driver transistor 162b in voltage downconverter 162 is turned on and voltage downconverter 162 operates to set supply potential V$_{DD2}$ at the level of reference potential V$_{REF}$.

In this way, when the P channel sense amplifier formed of transistors P1 and P2 of sense amplifier 141b is enabled, supply potential V$_{DD1}$ which is higher than supply potential V$_{DD2}$ stored in capacitor 141nf is applied to common source line 141e. Accordingly, amplification of the bit line to high level can be done speedily. In other words, a high speed sense operation is implemented. Such a structure is applicable to the third embodiment. When P channel transistor P5 in source potential control circuit 141n is turned on, driver transistor 162b in voltage downconverter 162 is turned off. Therefore, it is possible to omit P channel transistor P6 in source potential control circuit 141n and directly connect the drain of driver transistor 162b to sense power supply line 141nb.

Fifth Embodiment

A further embodiment of the invention is hereinafter described in conjunction with FIGS. 14 to 16. A DRAM contained LSI in the fifth embodiment differs from those in the first to the third embodiments in that the fifth embodiment includes no power supply which applies power supply potential V$_{DD2}$. The structure of source potential control circuit 141n is also different from those in the first to the third embodiments.

Figure 14:
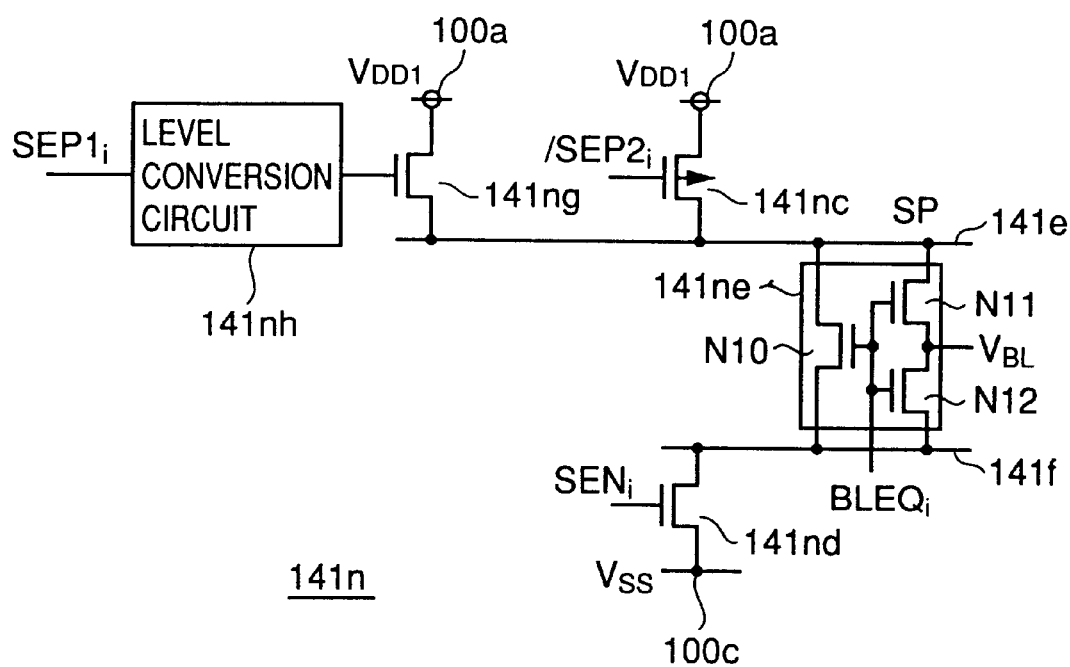
FIG. 14 is a circuit diagram illustrating a source potential control circuit in a DRAM contained LSI of a fifth embodiment of the invention.

FIG. 14 is a circuit diagram illustrating a source potential control circuit 141n. Referring to FIG. 14, source potential control circuit 141n does not include potential switch 141na which is shown in FIG. 5. The source of a P channel transistor 141nc is directly connected to a power supply node 100a receiving supply potential V$_{DD1}$. Further, source potential control circuit 141n is connected between power supply node 100a and a common source line 141e and additionally includes an N channel transistor 14lng having threshold V$_{th}$. Source potential control circuit 141n includes a level conversion circuit 141nh which converts the amplitude of V$_{DD3}$-V$_{SS}$ of P channel sense amplifier enable signal SEP1$_i$ to the amplitude of V$_{DD1}$-V$_{SS}$.

In response to P channel sense amplifier enable signals SEP1$_i$ and /SEP2$_i$, P channel transistor 141nc and N channel transistor 141ng are respectively turned on. In response to write operation request, N channel transistor 141ng is first turned on. At this time, N channel transistor 141ng receives supply potential V$_{DD1}$ at its gate so that potential V$_{DD1}$-V$_{th}$ lower than supply potential V$_{DD1}$ is applied to common source line 141e. If threshold voltage V$_{th}$ of N channel transistor 141ng is set at 0.5V, for example, potential of 1.5V is applied to common source line 141e as done in the first embodiment. After this, write data is applied to bit line pair 141a and then P channel transistor 141nc is turned on before reset of the potential on selected word line 141d. Therefore, supply potential V$_{DD1}$ is applied to common source line 141e.

Figure 15:
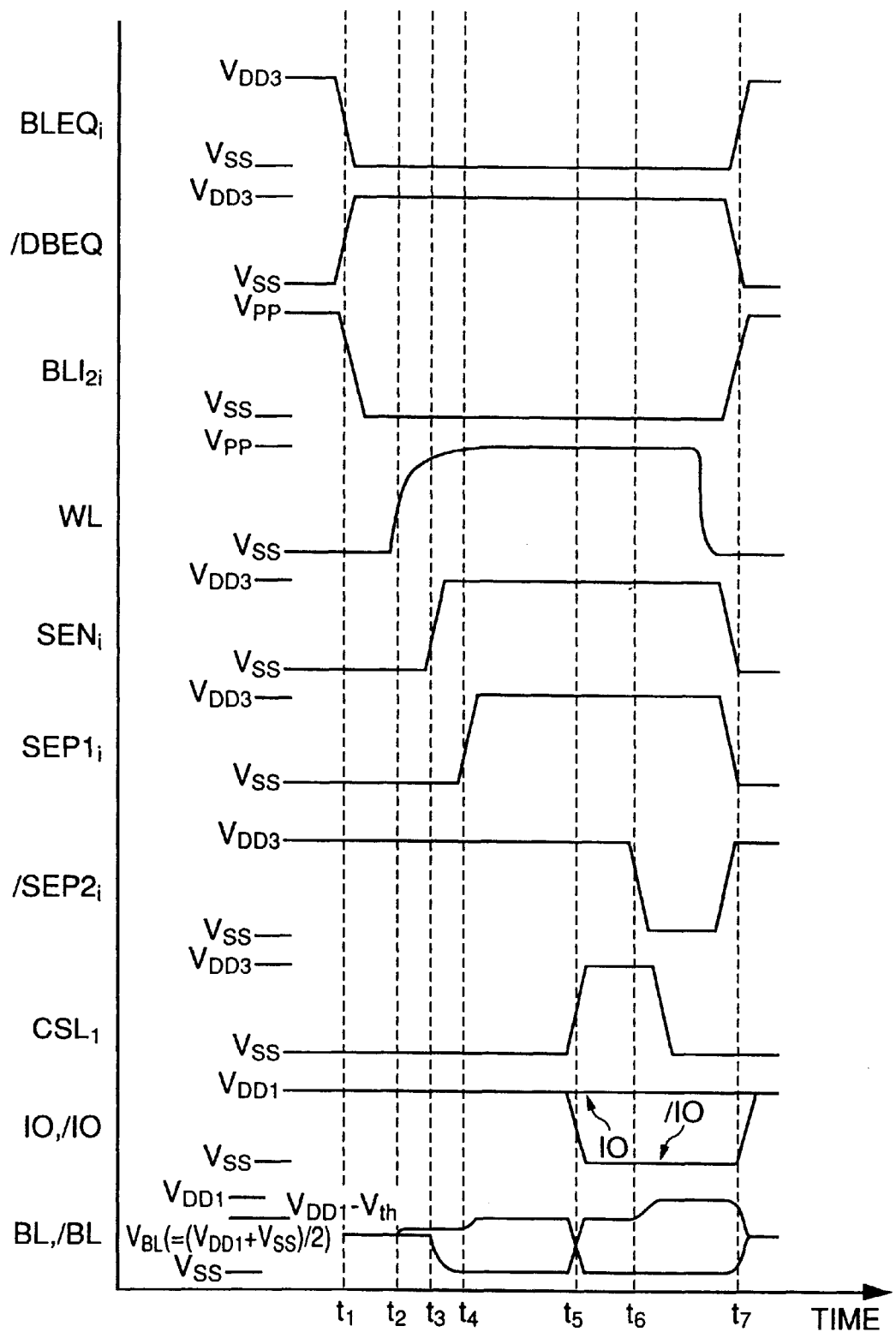
FIG. 15 is a timing chart illustrating a write operation in the DRAM in the DRAM contained LSI of the fifth embodiment of the invention.

FIG. 15 is a timing chart illustrating write operation presented for comparison with FIG. 6. Referring to FIG. 15, when P channel sense amplifier enable signal SEP1$_i$ attains active high level at time t$_4$, supply potential V$_{DD1}$ is applied to the gate of N channel transistor 141ng in source potential control circuit 141n. Potential V$_{DD1}$-V$_{th}$ is thus supplied to common source line 141e and potential /BL on the bit line is increased to potential V$_{DD1}$-V$_{th}$. Write data is then supplied to bit line pair 141a and potentials BL and /BL on the bit lines are inverted at time t$_5$. At time t$_6$, P channel sense amplifier enable signal /SEP2$_i$ attains active low level and P channel transistor 141nc in source potential control circuit 141n is turned on. Supply potential V$_{DD1}$ is thus supplied to common source line 141e so that potential BL on the bit line increases to supply potential V$_{DD1}$.

Figure 16:
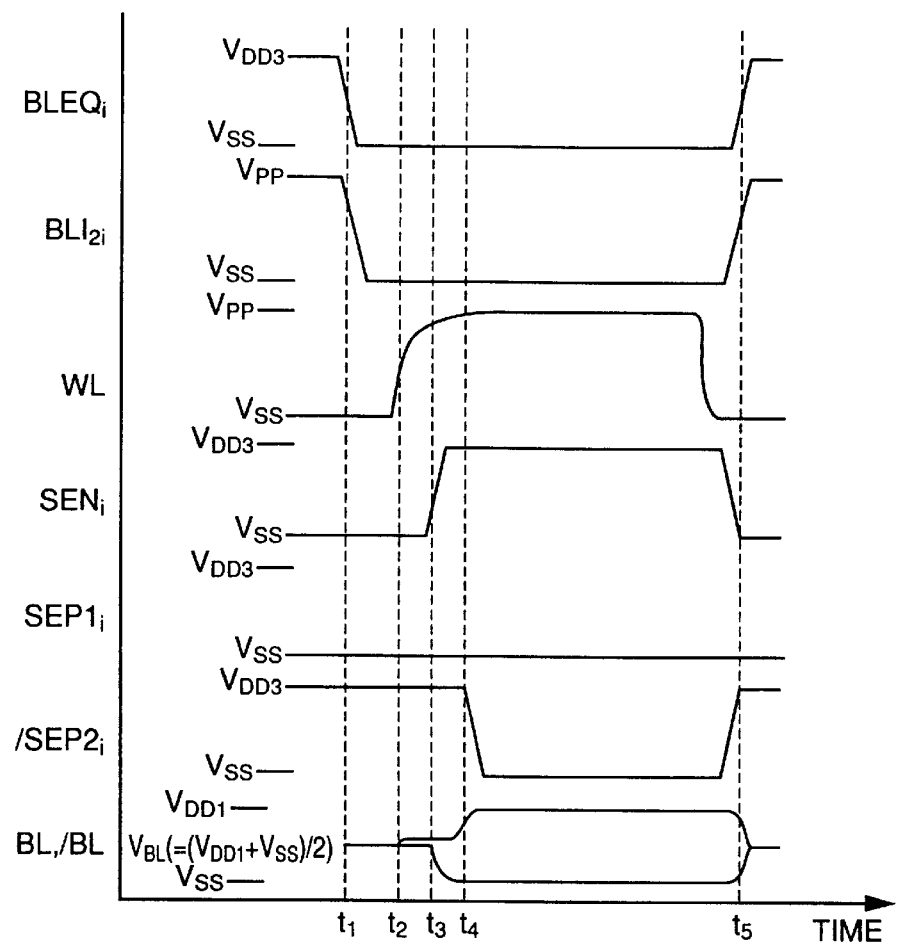
FIG. 16 is a timing chart illustrating read and refresh operations in the DRAM in the DRAM contained LSI of the fifth embodiment of the invention.

FIG. 16 is a timing chart illustrating read and refresh operations. Referring to FIG. 16, when read and refresh operations are requested, P channel sense amplifier enable signal SEP1$_i$ is kept at inactive low level. P channel sense amplifier enable signal /SEP2$_i$ changes to active low level at time t$_4$. In the read and refresh operations, potential /BL on the bit line is immediately raised to supply potential V$_{DD1}$ without reaching V$_{DD1}$-V$_{th}$ as in the write operation. As a result, the speed of read and refresh operations is not decreased and accordingly power consumption in the write operation can be reduced.

Sixth Embodiment

Figure 17:
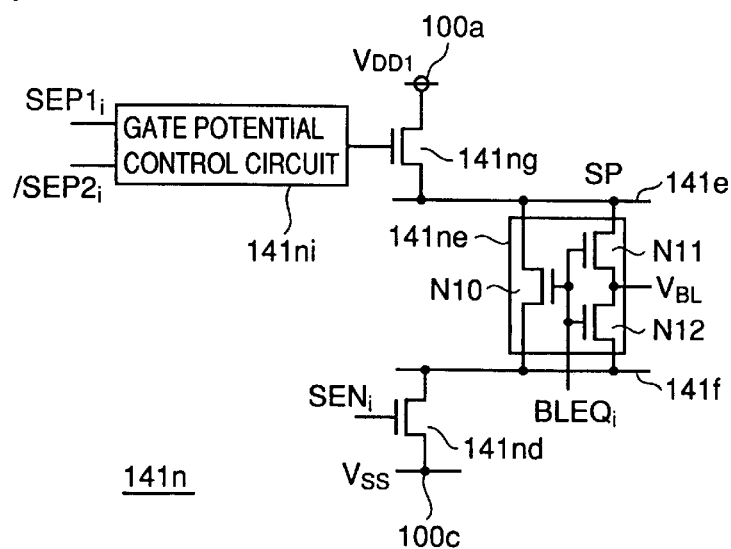
FIG. 17 is a circuit diagram illustrating a source potential control circuit in a DRAM contained LSI of a sixth embodiment of the invention.

A further embodiment of the invention is now described in conjunction with FIG. 17. A difference between a DRAM contained LSI in the sixth embodiment and that in the fifth embodiment is in the structure of source potential control circuit 141n. FIG. 17 is a circuit diagram illustrating a source potential control circuit 141n. Referring to FIG. 17, source potential control circuit 141n does not include P channel transistor 141nc included in FIG. 14. The gate of an N channel transistor 141ng is connected to a gate potential control circuit 141ni instead of level conversion circuit 141nh. P channel sense amplifier enable signals SEP1$_i$ and /SEP2$_i$ applied to gate potential control circuit 141ni are similar to those signals in the fifth embodiment.

When sense amplifier enable signal SEP1$_i$ is at active high level and sense amplifier enable signal /SEP2$_i$ is at inactive high level, gate potential control circuit 141ni applies supply potential V$_{DD1}$ to the gate of N channel transistor 141ng. When sense amplifier enable signal /SEP2$_i$ is at active low level, gate potential control circuit 141ni applies boosted potential V$_{PP}$ to the gate of N channel transistor 141ng. When sense amplifier enable signals SEP1$_i$ and /SEP2$_i$ are respectively at inactive low level and high level, gate potential control circuit 141ni applies potential at low level (V$_{SS}$) to the gate of N channel transistor 141ng.

In response to write operation request, N channel transistor 141ng thus receives supply potential V$_{DD1}$ at its gate, and receives at its gate boosted potential V$_{PP}$ which is equal to or higher than potential (V$_{DD1}$+V$_{th}$) greater than supply potential V$_{DD1}$ by threshold voltage V$_{th}$ of N channel transistor 141ng, after write data is supplied to bit line pair 141a and before reset of potential WL on selected word line 141d.

N channel transistor 141ng is turned off when low level potential is applied to its gate. When supply potential $V_{DD1}$ is applied to the gate of N channel transistor 141ng, potential $V_{DD1}-V_{th}$ is applied to common source line 141e through N channel transistor 141ng. Supply potential $V_{DD1}$ which is applied to the gate of N channel transistor 141ng at this time corresponds to potential which is greater than the potential applied to common source line 141e by the threshold voltage. When boosted potential $V_{PP}$ is applied to the gate, N channel transistor 141ng is turned on to apply supply potential $V_{DD1}$ to common source line 141e.

When read and refresh operations are requested, P channel sense amplifier enable signal SEP1$_i$ is at inactive low level so that potential /BL on the bit line is immediately raised to supply potential $V_{DD1}$ with the change of level of P channel sense amplifier enable signal /SEP2$_i$ to low level, without reaching $V_{DD1}-V_{th}$ as the write operation.

Seventh Embodiment

Figure 18:
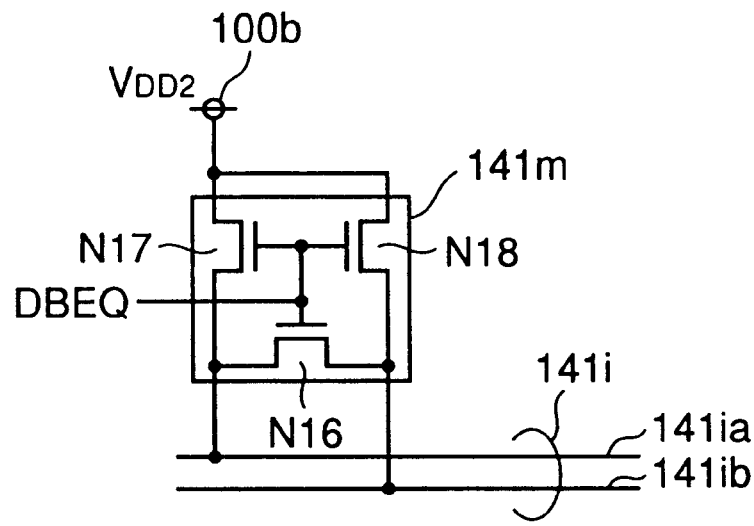
FIG. 18 is a circuit diagram illustrating a data bus precharge circuit in a DRAM contained LSI of a seventh embodiment of the invention.

A further embodiment of the invention is now described in conjunction with FIG. 18. A difference between a DRAM contained LSI in the seventh embodiment and those in the first to the fourth embodiments is that the precharge potential of local data bus 141i and global data bus 141k is supply potential $V_{DD1}$ in the first to the fourth embodiments while the precharge potential is set at potential (specifically supply potential $V_{DD2}$) lower than supply potential $V_{DD1}$ in the seventh embodiment. Therefore, the structure of a data bus precharge circuit 141m in the seventh embodiment is different from that in FIG. 4.

Referring to FIG. 18, a data bus precharge circuit 141m includes an N channel transistor N16 which is connected between I/O lines 14lia and 14lib which constitute a local data bus 141i and receives data bus equalize signal DBEQ at its gate. Data bus precharge circuit 141m further includes an N channel transistor N17 which is connected between a power supply node 100b and one I/O line 141ia and receives data bus equalize signal DBEQ at its gate. Data bus precharge circuit 141m further includes an N channel transistor N18 which is connected between power supply node 100b and the other I/O line 141ib and receives data bus equalize signal DBEQ at its gate.

Data bus equalize signal DBEQ is an inverted version of data bus equalize signal /DBEQ in the first to the fourth embodiments and has amplitude $V_{DD3}-V_{SS}$. Data bus precharge circuit 141m responds to data bus equalize signal DBEQ to precharge potential on data bus 141i to supply potential $V_{DD2}$ which is lower than supply potential $V_{DD1}$ and at least supply potential $V_{DD2}$.

Power consumption is thus decreased by making precharge potential on the data bus smaller than supply potential $V_{DD1}$. In particular, the degree of decrease in the power consumption is large in a DRAM contained LSI having a wide data bus. It is noted that unlimited reduction of precharge potential on the data bus is impossible and the reduction of the precharge potential is accomplished by decreasing drive potential of the sense amplifier to supply potential $V_{DD2}$ in the write operation. The reason is that if the amplitude of write data transmitted through the data bus is smaller than the amplitude of data stored in the sense amplifier, much time is consumed for inverting the data stored in the sense amplifier to write data. In this way, reduction of power consumption is achieved while maintaining a sufficient ability of inverting data stored in the sense amplifier to the write data.

Inversion of data stored in the sense amplifier due to reduction of precharge potential on the data bus below supply potential $V_{DD1}$ can be avoided in mask write operation. The mask write operation is now described in conjunction with FIG. 4. The mask write operation is done in order to prevent a part of a plurality of bits of write data from being written. In the mask write operation, transfer gate 141j is turned on according to column selection signals $CSL_1-CSL_4$. However, write data is not supplied to local data bus 141i and global data bus 141k and potentials IO and /IO on the data bus are kept precharged.

Consequently, the higher the precharge potential than drive potential of the sense amplifier, the higher the possibility of inversion of data stored in sense amplifier 141b. The mask write operation is done in order to prevent write of a part of bits of the write data without inversion of data stored in sense amplifier 141b. Therefore, inversion of stored data is not preferable. This problem can be overcome by reducing precharge potential on the data bus.

Eighth Embodiment

A further embodiment of the invention is described below in conjunction with FIG. 19. In the fifth and sixth embodiments, supply potential $V_{DD2}$ is not applied so that reduction of potential on the data bus with data bus precharge circuit 141m as shown in FIG. 18 is impossible. According to the eighth embodiment, a data bus precharge circuit 141m is structured as shown in FIG. 19 so as to reduce potential on the data bus as done in the seventh embodiment.

Figure 19:
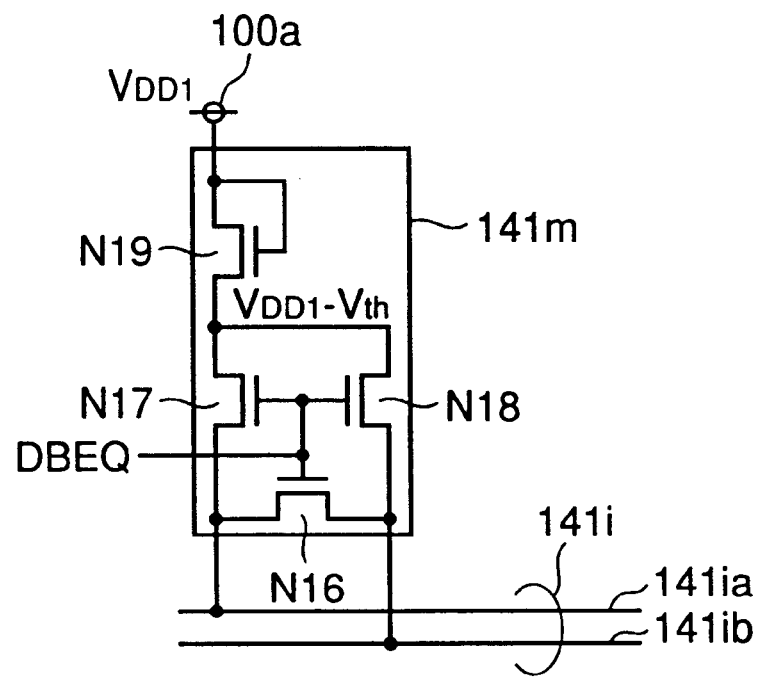
FIG. 19 is a circuit diagram illustrating a data bus precharge circuit in a DRAM contained LSI of an eighth embodiment of the invention.

Referring to FIG. 19, data bus precharge circuit 141m newly includes an N channel transistor N19 which is connected between a power supply node 100a and transistors N17 and N18 and receives supply potential $V_{DD1}$ at its gate in addition to the components of data bus precharge circuit 141m shown in FIG. 18. N channel transistor N19 has threshold voltage $V_{th}$. Potential $V_{DD1}-V_{th}$ is present at the source of transistor N19 and accordingly precharge potential at supply potential $V_{DD1}$ on the data bus can be reduced.

Ninth Embodiment

Figure 20:
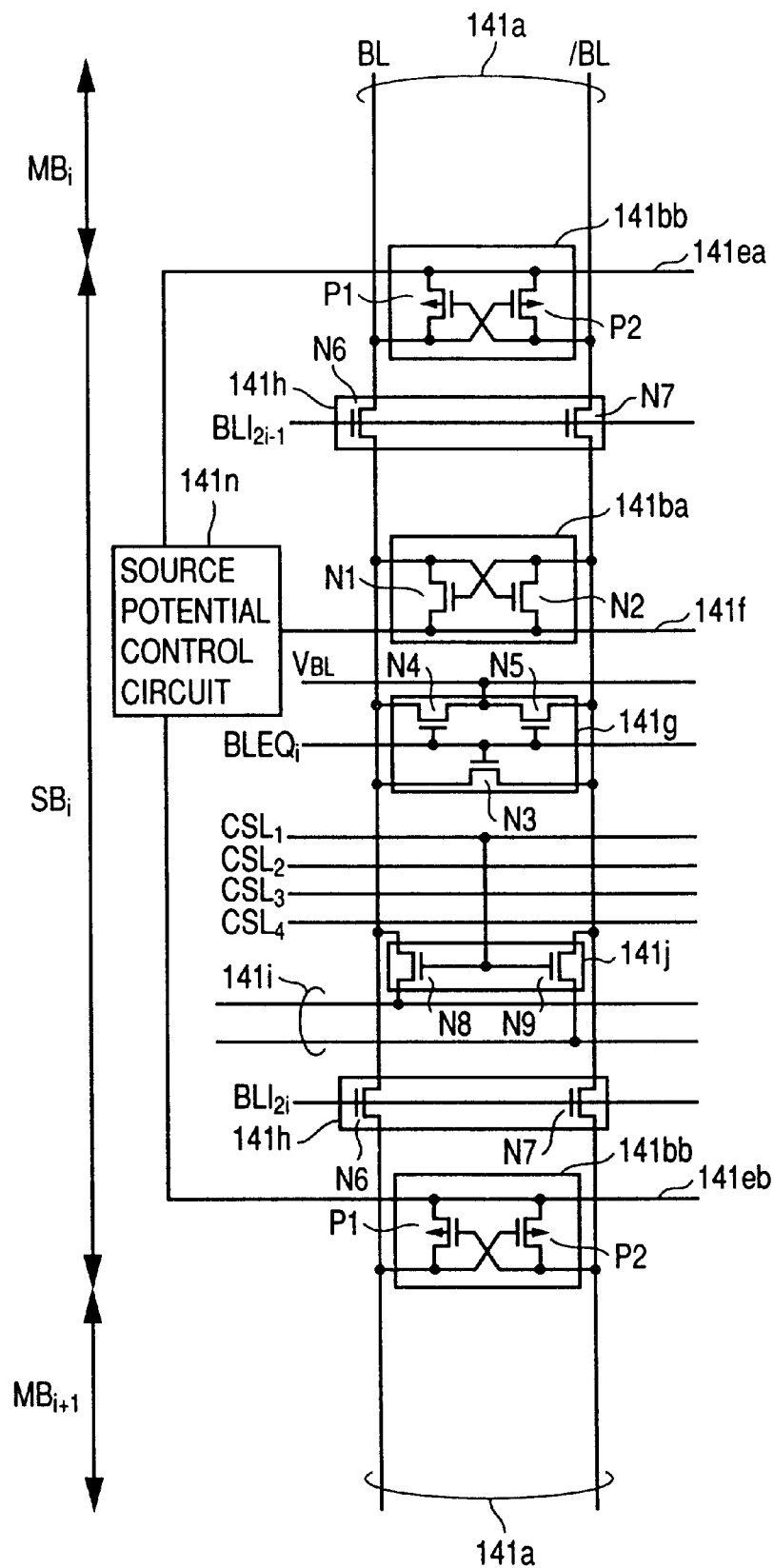
FIG. 20 is a circuit diagram illustrating a memory array in a DRAM contained LSI of a ninth embodiment of the invention.

A further embodiment of the invention is now described in conjunction with FIG. 20. A difference between the ninth embodiment and the seventh and eighth embodiments is that the P channel sense amplifier of the sense amplifier is not shared by bit line pairs 141a included respectively in memory blocks $MB_i$ and $MB_{i+1}$ adjacent to each other in the ninth embodiment. A further difference is that bit line isolation signals $BLI_{2i}$ and $BLI_{2i-1}$ are not increased to boosted potential $V_{PP}$ in the ninth embodiment.

Referring to FIG. 20, the sense amplifier includes an N channel sense amplifier 141ba shared by bit line pairs 141a included respectively in memory blocks $MB_i$ and $MB_{i+1}$ adjacent to each other and P channel sense amplifiers 141bb connected to bit line pairs 141a included respectively in memory blocks $MB_i$ and $MB_{i+1}$ adjacent to each other. Common source lines 141ea and 141eb are provided respectively to P channel sense amplifiers 141bb and each connected to associated sense amplifier 141bb. Each of P channel sense amplifiers 141bb amplifies potential on one bit line of bit line pair 141b connected thereto to potential on source line 141ea or 141eb.

Bit line isolation signals $BLI_{2i-1}$ and $BLI_{2i}$ are generated by a row decoder 142. The high level of bit line isolation signals does not correspond to boosted potential $V_{PP}$. The high level is reduced to non-boosted potential of supply potential $V_{DD3}$ or $V_{DD1}$, not to boosted potential $V_{PP}$. In other words, row decoder 142 supplies the non-boosted potential to the gate of N channel transistor pair 141h. Power consumption is accordingly decreased since the high level of the bit line isolation signals is decreased from boosted potential $V_{PP}$ to the non-boosted potential of $V_{DD3}$ or $V_{DD1}$.

The potential of high level transmitted by local data bus 141$i$ is set at supply potential $V_{DD2}$ or $V_{DD1}-V_{th}$ which is lower than supply potential $V_{DD1}$. Therefore, if threshold voltage of N channel MOS transistors N6 and N7 is equal to or lower than $V_{DD1}-V_{DD2}$ or $V_{th}$, potential of high level ($V_{DD2}$ or $V_{DD1}-V_{th}$) can be transmitted to bit line 141$a$ without boosting bit line isolation signals $BLI_{2i-1}$ and $BLI_{2i}$ and without reduction in voltage due to threshold of N channel MOS transistors N6 and N7.

When memory block $MB_i$ is selected, bit line isolation signals $BLI_{2i-1}$ and $BLI_{2i}$ respectively reach high level ($V_{DD3}$ or $V_{DD1}$) and low level ($V_{SS}$) and accordingly, bit line pair 141$a$ in memory block $MB_{i+1}$ is disconnected from N channel sense amplifier 141$ba$. When memory block $MB_{i+1}$ is selected, bit line isolation signals $BLI_{2i-1}$ and $BLI_{2i}$ attain respectively low level ($V_{SS}$) and high level ($V_{DD3}$ or $V_{DD1}$) so that bit line pair 141$a$ in memory block $MB_i$ is disconnected from N channel sense amplifier 141$ba$.

Source potential control circuit 141$n$ precharges and equalizes potentials on common source lines 141$ea$, 141$eb$ and 141$f$ to precharge potential $V_{BL}$ when bit line equalize signal $BLEQ_i$ is at high level. When bit line equalize signal $BLEQ_i$ is at low level, source potential control circuit 141$n$ stops precharging and equalizing of common source lines 141$ea$, 141$eb$ and 141$f$.

In response to request of write, read and refresh operations, source potential control circuit 141$n$ applies supply potential $V_{SS}$ to common source line 141$f$. Source potential control circuit 141$n$ responds to request of write operation to apply potential ($V_{DD2}$ or $V_{DD1}-V_{th}$) lower than supply potential $V_{DD1}$ to any of common source lines 141$ea$ and 141$eb$ which is associated with a selected memory block and apply supply potential $V_{DD1}$ to this common source line after write data is supplied to bit line pair 141$a$.

When read or refresh operation excluding write operation is requested, source potential control circuit 141$n$ applies only power supply potential $V_{DD1}$ to any of common source lines 141$ea$ and 141$eb$ which is associated with a selected memory block and does not apply potential ($V_{DD2}$ or $V_{DD1}-V_{th}$) which is lower than supply potential $V_{DD1}$.

Tenth Embodiment

A further embodiment of the invention is now described below. A difference between the tenth embodiment and the seventh to the ninth embodiments is that potential of high level of column selection signals $CSL_1-CSL_4$ is set at supply potential $V_{DD1}$ which is lower than supply potential $V_{DD3}$. Accordingly power consumption is decreased. Reduction of power consumption is achieved by decreasing potential of high level transmitted by global or local data bus 141$k$ or 141$i$ is decreased to potential $V_{DD2}$ or $V_{DD1}-V_{th}$ which is lower than supply potential $V_{DD1}$. If threshold voltage of N channel MOS transistors N6 and N7 in transfer gate 141$j$ is equal to or less than $V_{DD1}-V_{DD2}$ or $V_{th}$, potential of high level ($V_{DD2}$ or $V_{DD1}-V_{th}$) can be transmitted to bit line 141$a$ without voltage drop due to the threshold voltage.

The speed of read and write operations could become slower by lowering potential of high level of column selection signals $CSL_1-CSL_4$. The high level may be switched by setting the high level at $V_{DD3}$ higher than supply potential $V_{DD1}$ when enhancement of speed is required at sacrifice of power consumption and setting the high level at supply potential $V_{DD1}$ when decrease of power consumption is required at sacrifice of enhancement of the speed.

Eleventh Embodiment

A further embodiment of the invention is described below in conjunction with FIG. 21. In the first to the tenth embodiments discussed above, potential on one bit line of the bit line pair is amplified to potential lower than supply potential $V_{DD1}$ and then amplified to supply potential $V_{DD1}$ in the write operation. Therefore, it takes much time from the start of sense operation by the sense amplifier to completion of the write operation compared with the conventional DRAM in which the potential is simply amplified to supply potential $V_{DD1}$ at first. This means the write operation cycle time could be longer.

In the eleventh embodiment, in order to solve this problem, the multi-bank structure including banks A-D of the DRAM in the first to the tenth embodiments is utilized to implement pipe line operation of a plurality of banks. Even if write operation cycle time in each bank becomes longer, the cycle time overlaps write operation cycle in the following bank. Consequently, the effective write cycle time can be shortened.

Figure 21:
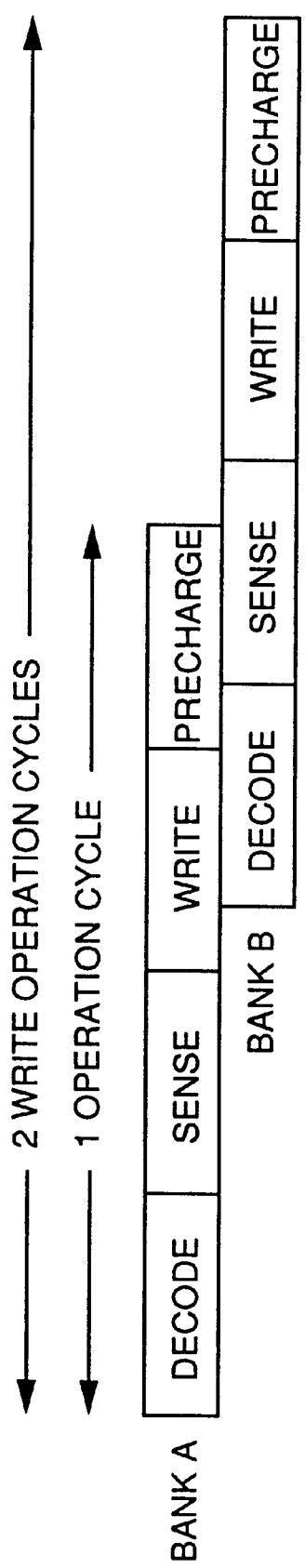
FIG. 21 illustrates a write operation in a DRAM contained LSI of an eleventh embodiment of the invention.

FIG. 21 illustrates a write operation sequence in DRAM 100 according to the first to the tenth embodiments. Referring to FIG. 21, in the write operation cycle, first the row decoder decodes a row address signal to select a word line, the sense amplifier next senses the potential difference generated at the bit line pair and amplifies it, then write data is written into a memory cell, finally the bit line pair and data bus are precharged and the write operation cycle is completed.

As shown in FIG. 21, start of the write operation in bank B is not after completion of write operation cycle in bank A. The write operations in banks A and B are overlapped so as to decrease the time for two consecutive write operation cycles to the time shorter than the time which is twice the one write operation cycle.

Although the first to the eleventh embodiments are applied to the DRAM contained LSI, the invention is applicable to a normal DRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a plurality of pairs of bit lines each connected to a plurality of memory cells;

first and second source lines;

a plurality of sense amplifiers provided corresponding to said pairs of bit lines respectively and each connected to said first and second source lines to amplify potential on one bit line of a corresponding one of said pairs of bit lines to potential on said first source line and amplify potential on the other bit line to potential on said second source line; and a source potential control circuit supplying, when a write operation is requested, a first potential to said first source line, supplying a second potential lower than said first potential to said second source line, and supplying a third potential higher than said first potential to said first source line after supply of write data to the pair of bit lines.

2. The semiconductor device according to claim 1, wherein
said source potential control circuit maintains, when a read operation is requested, said first source line and said second source line respectively at said third potential and said second potential during activation of said sense amplifiers.

3. The semiconductor device according to claim 1, wherein
said source potential control circuit maintains, when a refresh operation is requested, said first source line and said second source line respectively at said third potential and said second potential during activation of said sense amplifiers.

4. The semiconductor device according to claim 1, wherein
said source potential control circuit includes:
a capacitor;
a sense power supply line connected to the other end of said capacitor; and
a transistor connected between said sense power supply line and said first source line to receive a sense amplifier enable signal at its gate, and
said first potential is supplied to said first source line via said sense power supply line when potential on said sense power supply line decreases from the third potential due to connection of said pairs of bit lines to said first and second source lines in said write operation.

5. The semiconductor device according to claim 4, further comprising a potential downconverter circuit receiving external supply potential to supply said third potential to said sense power supply line.

6. The semiconductor device according to claim 4, wherein
said source potential control circuit further includes a switch connected between said sense power supply line and a power supply node to which said third potential is applied to disconnect said power supply node from said sense power supply line upon start of said write operation and connect said power supply node to said sense power supply line after supply of write data to the pair of bit lines.

7. The semiconductor device according to claim 1, wherein
said source potential control circuit includes:
an N channel MOS transistor connected between a power supply node to which said third potential is applied and said first source line, and turned on in said write operation to supply said first potential to said first source line; and
a P channel MOS transistor connected between said power supply node and said first source line, and turned on in said write operation after write data is supplied to the pair of bit lines to supply said third potential to said first source line.

8. The semiconductor device according to claim 1, wherein
said source potential control circuit includes:
an N channel MOS transistor connected between a power supply node to which said third potential is supplied and said first source line; and
a gate potential control circuit supplying a gate of said N channel MOS transistor with potential higher than said first potential by threshold voltage of said N channel MOS transistor before write data is supplied to the pair of bit lines and supplying the gate of said N channel MOS transistor with potential higher than said third potential by at least said threshold voltage after write data is supplied to the pair of bit lines.

9. The semiconductor device according to claim 1, further comprising:
a data bus shared by said plurality of pairs of bit lines;
a plurality of gate circuits connected between said plurality of pairs of bit lines and said data bus to selectively and electrically connect one of said plurality of pairs of bit lines to said data bus; and
a precharge circuit precharging potential on said data bus to potential being at least said first potential and lower than said third potential.

10. The semiconductor device according to claim 9, wherein
said precharge circuit includes a diode-connected MOS transistor located on a path by which a power supply node receiving said third potential is coupled to said data bus when said data bus is precharged.

11. The semiconductor device according to claim 9, wherein
each of said plurality of gate circuits includes a pair of N channel MOS transistors connected between a corresponding pair of bit lines and said data bus, and
said semiconductor device further comprises a column decoder for selectively supplying said third potential to gates of said pair of N channel MOS transistors.

12. The semiconductor device according to claim 9, wherein
high level of data transmitted by said data bus is at said first potential in both of a read operation and said write operation.

13. The semiconductor device according to claim 1, further comprising a plurality of precharge circuits precharging said plurality of pairs of bit lines respectively to an intermediate potential between said third potential and ground potential.

14. A semiconductor device comprising:
first and second pairs of bit lines each connected to a plurality of memory cells;
an N channel sense amplifier shared by said first and second pairs of bit lines;
a first pair of N channel MOS transistors connected between said N channel sense amplifier and said first pair of bit lines;
a second pair of N channel MOS transistors connected between said N channel sense amplifier and said second pair of bit lines;
first and second P channel sense amplifiers connected respectively to said first and second pairs of bit lines and each connected to a source line to amplify one bit line of the pair of bit lines connected to each P channel sense amplifier to potential on said source line;
a source potential control circuit supplying, when a write operation is requested, a first potential to said source line and supplying a second potential higher than said first potential to said source line after supply of write data to one of said first and second pairs of bit lines; and
a row decoder supplying a predetermined potential to gates of said first and second pairs of N channel MOS transistors.

15. The semiconductor device according to claim 14, wherein said predetermined potential is said second potential.

16. The semiconductor device according to claim 14, wherein said predetermined potential is a non-boosted potential.

17. A semiconductor device comprising first and second banks, said first bank including
- a first pair of bit lines connected to a plurality of memory cells;
- first and second source lines;
- a first sense amplifier connected to said first pair of bit lines and said first and second source lines to amplify potential on one bit line of said first pair of bit lines to potential on said first source line and amplify potential on the other bit line to potential on said second source line; and
- a first source potential control circuit supplying, when a write operation is requested, a first potential to said first source line, supplying a second potential lower than said first potential to said second source line, and supplying a third potential higher than said first potential to said first source line after supply of write data to said first pair of bit lines, said second bank including
- a second pair of bit lines connected to a plurality of memory cells;
- third and fourth source lines;
- a second sense amplifier connected to said second pair of bit lines and said third and fourth source lines to amplify potential on one bit line of said second pair of bit lines to potential on said third source line and amplify potential on the other bit line to potential on said fourth source line; and
- a second source potential control circuit supplying, when a write operation is requested, said first potential to said third source line, supplying said second potential to said fourth source line, and supplying said third potential to said third source line after supply of write data to said second pair of bit lines, and write operation in said second bank overlapping write operation in said first bank.

* * * * *